US012392873B2

(12) United States Patent
Khachaturian et al.

(10) Patent No.: US 12,392,873 B2
(45) Date of Patent: Aug. 19, 2025

(54) COHERENT PHOTONICS IMAGER WITH OPTICAL CARRIER SUPPRESSION AND PHASE DETECTION CAPABILITY

(71) Applicant: California Institute of Technology, Pasadena, CA (US)

(72) Inventors: Aroutin Khachaturian, Pasadena, CA (US); Behrooz Abiri, Los Angeles, CA (US); Seyed Mohammadreza Fatemi, Pasadena, CA (US); Seyed Ali Hajimiri, La Canada, CA (US)

(73) Assignee: CALIFORNIA INSTITUTE OF TECHNOLOGY, Pasadena, CA (US)

(*) Notice: Subject to any disclaimer, the term of this patent is extended or adjusted under 35 U.S.C. 154(b) by 727 days.

(21) Appl. No.: 17/726,867

(22) Filed: Apr. 22, 2022

(65) Prior Publication Data
US 2022/0400217 A1  Dec. 15, 2022

Related U.S. Application Data

(60) Provisional application No. 63/178,118, filed on Apr. 22, 2021.

(51) Int. Cl.
*G01S 7/4914* (2020.01)
*H01S 3/00* (2006.01)
(Continued)

(52) U.S. Cl.
CPC .......... *G01S 7/4914* (2013.01); *H01S 3/0007* (2013.01); *H04N 23/56* (2023.01);
(Continued)

(58) Field of Classification Search
CPC ..... G01S 7/4914; G01S 13/867; H04N 23/56; H01L 27/14625; H01L 27/14641; H01L 27/14643; H01S 3/0007
See application file for complete search history.

(56) References Cited

U.S. PATENT DOCUMENTS

| | | | |
|---|---|---|---|
| 7,417,744 B2* | 8/2008 | Cooke | G01B 11/24 356/512 |
| 8,558,993 B2 | 10/2013 | Newbury et al. | |
| 9,557,856 B2 | 1/2017 | Send et al. | |

FOREIGN PATENT DOCUMENTS

| | | |
|---|---|---|
| CN | 112511239 | 3/2021 |
| KR | 10-2007-0116749 | 12/2007 |

(Continued)

OTHER PUBLICATIONS

PCT International Search Report & Written Opinion dated Aug. 10, 2022 for PCT International Patent Application No. PCT/US2022/025913.

(Continued)

*Primary Examiner* — Georgia Y Epps
*Assistant Examiner* — Don J Williams
(74) *Attorney, Agent, or Firm* — Gates & Cooper LLP

(57) ABSTRACT

A coherent imaging system including a transmitter and a receiver. The transmitter includes a coherent source and a power splitter for splitting the electromagnetic radiation into a reference and a signal beam. The receiver includes an image forming device and an array of pixels. Each of the pixels include means for collecting at least a portion of the signal beam imaged on the pixel by an image forming device, as a collected signal; means for splitting the collected signal into a plurality of collected signals each having different phase shifts; means for mixing each of the collected signals with the reference beam so as to form a plurality of mixed signals; and means for detecting the mixed signals and outputting a plurality of output electrical signals in response to the mixed signals.

19 Claims, 20 Drawing Sheets

(51) Int. Cl.
  *H04N 23/56* (2023.01)
  *H10F 39/00* (2025.01)
  *H10F 39/18* (2025.01)
  *G01S 13/86* (2006.01)

(52) U.S. Cl.
  CPC ........... *H10F 39/18* (2025.01); *H10F 39/806* (2025.01); *H10F 39/813* (2025.01); *G01S 13/867* (2013.01)

(56) References Cited

FOREIGN PATENT DOCUMENTS

| KR | 10-2019-0092532 | 8/2019 |
|---|---|---|
| WO | 2021000026 | 1/2021 |

OTHER PUBLICATIONS

Abiri et al., "A 1-D Heterodyne Lens-Free Optical Phased Array Camera With Reference Phase Shifting," in IEEE Photonics Journal, vol. 10, No. 5, pp. 1-12, Oct. 2018, Art No. 6601712, doi: 10.1109/JPHOT.2018.2871823.

Aflatouni et al., "Nanophotonic coherent imager," Opt. Express 23, 5117-5125 (2015).

Aflatouni et al., "Nanophotonic projection system," Opt. Express 23, 21012-21022 (2015).

Behroozpour et al., "11.8 Chip-scale electro-optical 3D FMCW lidar with 8 μm ranging precision," 2016 IEEE International Solid-State Circuits Conference (ISSCC), San Francisco, CA, USA, 2016, pp. 214-216, doi: 10.1109/ISSCC.2016.7417983.

European Search Report dated Feb. 17, 2025 for European Application No. 22792566.6.

\* cited by examiner

COHERENT PHOTONICS IMAGER WITH OPTICAL CARRIER SUPPRESSION AND PHASE DETECTION CAPABILITY

CROSS REFERENCE TO RELATED APPLICATIONS

This application claims the benefit under 35 USC 119(e) of commonly assigned U.S. Provisional Patent Application Ser. No. 63/178,118, filed Apr. 22, 2021, by Aroutin Khachaturian, Behrooz Abiri, Seyed Mohammadreza Fatemi, and Seyed Ali Hajimiri, entitled "COHERENT PHOTONICS IMAGER WITH OPTICAL CARRIER SUPPRESSION AND PHASE DETECTION CAPABILITY," (CIT-8637-P), which application is incorporated by reference herein.

BACKGROUND OF THE INVENTION

1. Field of the Invention

The present invention relates to coherent imaging systems and methods of making the same.

2. Description of the Related Art

Traditional image sensors (CCD or CMOS) function based on direct detection and are limited in performance due to dark current noise and electrical read noise. Mechanical and MEMS devices in conjunction with coherent sources are one method of improving on these traditional camera sensors. However, the scan rate is limited to the kHz regime and would require external bulky optical components for coherent detection.

Integrated photonics platforms, on the other hand, offer the possibility of complex signal processing in each pixel without requiring external optical components. Moreover, coherent beamforming can be achieved via integrated beamforming using an optical phased array [1]. Coherent imagers [2]-[4] function based on heterodyne detection and offer improved range and resolution due to increased signal sensitivity. After heterodyne mixing, the down-converted electrical signal contains the desired signal incorporated in the phase or amplitude of the optical signal, enabling the receivers to operate close to the shot-noise limited regime. The main challenge with heterodyne detectors, however, is that variation in the imperfections of the coherent laser source (relative intensity noise and phase noise) appear as sources of noise and interfere with the detection signal. This increases the required signal acquisition time to average and cancel out the undesired signals. Another challenge with coherent imagers is the increased interconnect density and channel to channel isolation. What is needed is a coherent imaging system with reduced noise and interconnect density. The present disclosure satisfies this need.

SUMMARY OF THE INVENTION

Example coherent imaging systems and detector arrays according to embodiments of the present invention include, but are not limited to, the following.

1. A coherent imaging system, comprising:
a transmitter comprising:
 a coherent source of electromagnetic radiation;
 a power splitter for splitting the electromagnetic radiation into a reference and a signal beam transmitted to a target; and
a receiver positioned to receive the signal beam reflected from, or transmitted through, the target, the receiver comprising:
an image forming device; and
an array of pixels, each of the pixels comprising:
 a capture area for collecting a portion of the signal beam imaged on the capture area by the image forming device, as a collected signal;
 a plurality of waveguides distributing the reference and the collected signal, along a plurality of paths, to a plurality of couplers, wherein:
  the collected signals in different paths have different phase shifts; and
  each of the couplers mix the reference with a different one of the collected signals having a different one of the phase shifts so as to form a plurality of mixed signals; and
 a plurality of detectors coupled to outputs of the couplers so as to detect each of the mixed signals and output a plurality of output signals in response thereto.

2. The coherent imaging system of example 1, wherein:
the couplers comprise a first coupler and a second coupler;
the collected signals comprise a first signal and a second signal having the phase shift of 90 degrees relative the first signal;
the mixed signals comprise a first mixed signal and a second mixed signal;
the first coupler mixes the first signal with the reference to form the first mixed signal comprising an in-phase signal;
the second coupler mixes the second signal with the reference to form the second mixed signal comprising a quadrature signal; and
the detectors comprise a first detector detecting the in-phase signal and a second detector detecting the quadrature signal.

3. The coherent imaging system of example 2, further comprising a circuit summing the squares of the output signals.

4. The coherent imaging system of example 1, wherein:
the collected signals comprise a first signal, a second signal having the phase shift of a first angle relative to the first signal; a third signal having the phase shift of a second angle relative to the first signal; and a fourth signal having the phase shift of a third angle relative to the first signal;
the couplers comprise a first coupler, a second coupler, a third coupler, and a fourth coupler outputting the mixed signals comprising a first mixed signal, a second mixed signal, a third mixed signal, and a fourth mixed signal; and
the detectors comprise a first detector detecting the first mixed signal, a second detector detecting the second mixed signal, a third detector detecting the third mixed signal, and a fourth detector detecting the fourth mixed signal.

5. The coherent imaging system of example 1, wherein the transmitter and the receiver share an aperture, so that:
the signal beam is transmitted to the target from the transmitter through the aperture, and
the signal beam is received in the receiver through the aperture.

6. The coherent imaging system of example 5, wherein the transmitter and the receiver comprise the aperture sharing optical antennas, so that the optical antennas transmit the signal beam to the target and the optical antennas receive the signal beam from the target.

7. The coherent imaging system of example 5, wherein the transmitter and receiver comprise the aperture sharing an optical beamforming system, so that the optical beamforming system forms:
the signal beam transmitted from the transmitter onto the target, and
the signal beam received from the target onto the pixels.

8. The coherent imaging system of example 1, wherein:
the receiver further comprises an electrical control circuit, the electrical control circuit biasing the pixels so as to:
select readout of the output signals from one or more selected rows of the pixels, and
de-activate the readout from the remaining rows of the pixels.

9. The system of example 8, wherein:
the pixels are disposed in rows and columns;
the electrical control circuit comprises:
a plurality of common row bias lines coupled to each of the pixels in one or more of the rows; and
a plurality of common column bias lines coupled to each of the pixels in one or more of the columns;
each of the pixels further comprise:
each of the detectors comprising two balanced photodiodes connected in series between a pair of the common row bias lines;
protection resistors in parallel with the photodiodes and between the pair of the common row bias lines;
at least one diode, comprising an anode and a cathode, connected in series with an output from the photodiodes; and
wherein:
the pair of common row bias lines bias the photodiodes in reverse bias and set a voltage of the anode; and
the common column bias lines bias the cathode;
so that:
the diodes in the selected rows are forward biased for the readout of the output signals from the one or more selected rows; and
the diodes in the remaining rows are reverse biased.

10. The system of example 1, wherein the receiver further comprises a splitter only distributing the reference to one or more selected rows of the pixels so as to select readout of the output signals from the one or more selected rows of the pixels and de-activate readout from the remaining rows of the pixels.

11. The system of example 10, wherein the splitter comprises one or more interferometers, each of the interferometers comprising:
a first branch having a first output and an input for receiving the reference;
a second branch having a second output;
a first coupler coupling the first branch and the second branch;
a second coupler coupling the first branch and the second branch, wherein the second branch is positioned in series with the first branch; and
a voltage tunable modulator coupled to the first branch or the second branch, the voltage tunable modulator controlling a relative phase of the reference in at least one of the first branch or the second branch, in response to a voltage signal inputted to the voltage modulator, so as to control a relative power of the reference outputted at the first output and the second output.

12. The system of example 11, wherein:
the splitter further comprises a reference detector coupled to the interferometer, the reference detector outputting a current signal monitoring a fraction of the relative power of the reference at the first output or the second output; and
the system further comprising a power distribution circuit controlling the voltage signal using the current signal as feedback.

13. The system of example 12, wherein:
the splitter comprises a plurality of the interferometers comprising cascaded interferometers,
the interferometers are distributed in M layers, such that the first output and the second output of the one or more interferometers, in a previous one of the layers, are each fed to the input of a different one of the interferometers in a next one of the layers, allowing splitting of the reference, inputted to the input of the interferometer in a first one of the layers, to N outputs comprising the first outputs and second outputs of the interferometers in the last one of the layers; and
the voltage signals required for allocating the power to the $N=2^M$ outputs are calibrated for M layers, by the power distribution circuit, for each of the interferometers in the j layers $1 \leq j \leq M$, starting with $j=1$:
(a) recording the voltage signals applied to each of the interferometers in the $j^{th}$ layer, and the sum of the current signals outputted from all the interferometers in the $j^{th}$ layer, when routing all the power to a top most branch and a bottom most branch in the $(j+1)^{th}$ layer; and
(b) adjusting the voltage signals to the interferometers in the $(j+1)^{th}$ layer and noting the sum of the current signals outputted from the interferometers in the $(j+1)^{th}$ layer when routing different powers of the reference to each of the remaining outputs in the $(j+1)^{th}$ layer, taking into account knowledge obtained in (a); and
such that all the voltage signals are calibrated using only a number M of current nodes, wherein the $j^{th}$ current node comprises the sum of the current signals outputted from the $j^{th}$ layer.

14. The system of example 1, wherein:
the beamformer comprises at least one of a first lens, a first mirror, a first beam steerer, or a first optical phased array irradiating an entirety of the target with the signal beam or one or more different points on the target with the signal beam comprising one or more collimated beams; and
the image forming device comprises at least one of a second lens, a second mirror, a second beam steerer, or a second optical phased array imaging the signal beam, after interaction with the target, onto the pixels.

15. The system of example 1, wherein the receiver comprises at least one of the following:
the receiver comprising a control circuit adjusting a reference phase of the reference transmitted to each of the pixels, so that each of the pixels receive the reference having a different reference phase, or
a modulator modulating the electromagnetic radiation with at least one of a linear frequency chirp or at least one of a binary encoded phase or amplitude, so as to extract time domain information from the output signals for a ranging application.

16. The system of example 1, wherein the capture area comprises one or more optical antennas.

17. The coherent imaging system of example 1, wherein:
the coherent imaging system is configured so that the output signals may be used in an application selected from coherent tomography, LIDAR, remote sensing, robotics, automation, aerial imaging, or spectroscopy, and
the source of coherent electromagnetic radiation comprises one or more lasers.

18. The multi-modal imaging system comprising of the system in example 1 in combination with at least one of a complementary meal-oxide semiconductor imager (CMOS) imager or a radio frequency (RF) radar system.

19. The imaging system of example 1 further comprising a computer comprising one or more processors; one or more memories; and one or more computer executable instructions stored on the one or more memories, wherein the computer executable instructions are configured to execute at least one of:
a first artificial intelligence or machine learning algorithm compressing imager output data obtained from the output signals, or
a second artificial intelligence or machine learning algorithm analyzing data obtained from or comprising the output signals, so as to detect the target or classify the target.

20. A detector array for coherent detection of electromagnetic radiation, comprising:
an array of pixels, each of the pixels comprising:
means for collecting at least a portion of a signal beam imaged on the pixel by an image forming device, as a collected signal;
means for splitting the collected signal into a plurality of collected signals each having different phase shifts;
means for mixing each of the collected signals with a reference beam so as to form a plurality of mixed signals; and
means for detecting the mixed signals and outputting a plurality of output electrical signals in response to the mixed signals.

21. The detector array of example 20, wherein the means for collecting, the means for splitting, the means for mixing, and the means for outputting comprise one or more photonic integrated circuits.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized, and structural changes may be made without departing from the scope of the present invention.

Technical Description

Example Coherent Imaging System

Figure 1:
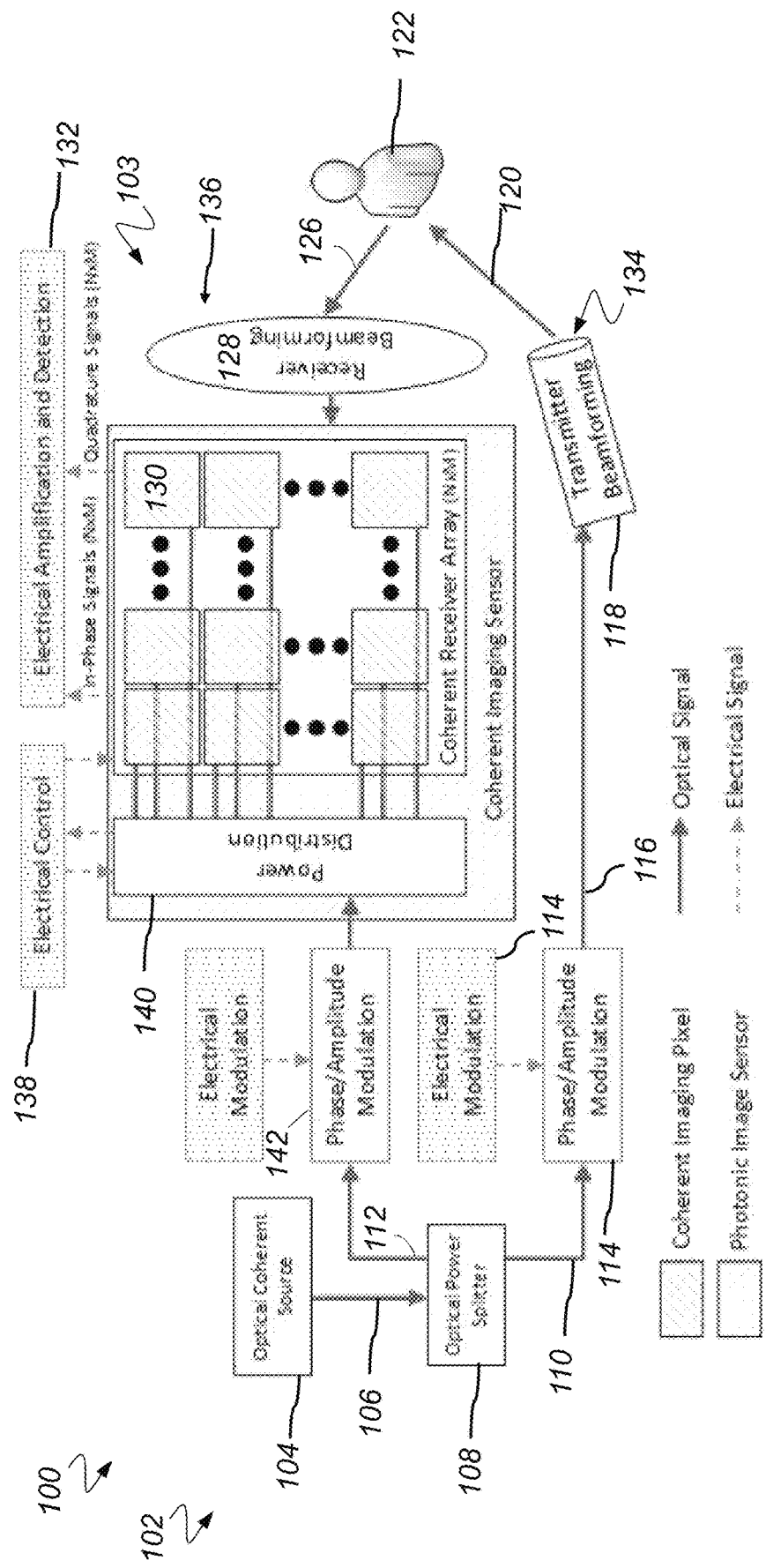
FIG. 1. Schematic illustration of a coherent imaging system.

FIG. 1 illustrates a coherent imaging system 100 comprising a transmitter 102 and a receiver 103. The transmitter 102 comprises a coherent source 104 of electromagnetic radiation 106; a power splitter 108 for splitting the electromagnetic radiation into a reference 112 and a signal beam 110; a modulator 114 for modulating at least one of a phase or an amplitude of the electromagnetic radiation, so as to form modulated electromagnetic radiation 116; and a beamformer 118 transmitting the signal beam (comprising the modulated electromagnetic radiation) to a target 122. The receiver 103 is positioned to receive the signal beam 126 reflected from, or transmitted through, the target 122. The receiver comprises an image forming device 128 and an array of pixels 130.

The coherence time of the coherent light source may vary depending on the application. For example, coherent light sources comprising low-cost Vertical Cavity Surface Emitting Lasers (VCSEL) or Distributed Feedback Lasers (DFB) having longer coherent times ma be used for short range (few meters) 3D imaging applications.

The transmitter 102 may illuminate the target as a whole or point by point. The receiver 103 processes the light from the target, processes and extracts the amplitude and phase of the return signal, and then processes the return signal to form an image.

As illustrated in FIG. 1, the receiver block and the transmitter block may optionally contain modulators that encode electrical signals in the phase and/or amplitude of the optical signal outputted from the coherent light source. Sinusoidal electrical signals may be used for heterodyne detection, for example. In one or more ranging applications, the electrical modulation comprises a linear frequency chirp or binary encoded phase/amplitude so that time domain information may be extracted from the images of the target. In one or more homodyne implementations, modulation is not required.

Beamforming and image forming may be achieved using a variety of devices including, but not limited to, a physical lens, a mirror, solid state optical phased arrays, or mechanical steering. In one embodiment, the target is illuminated entirely with a flash in which case no beam steering is required.

Example Coherent Imaging Unit Cell

Figure 2:
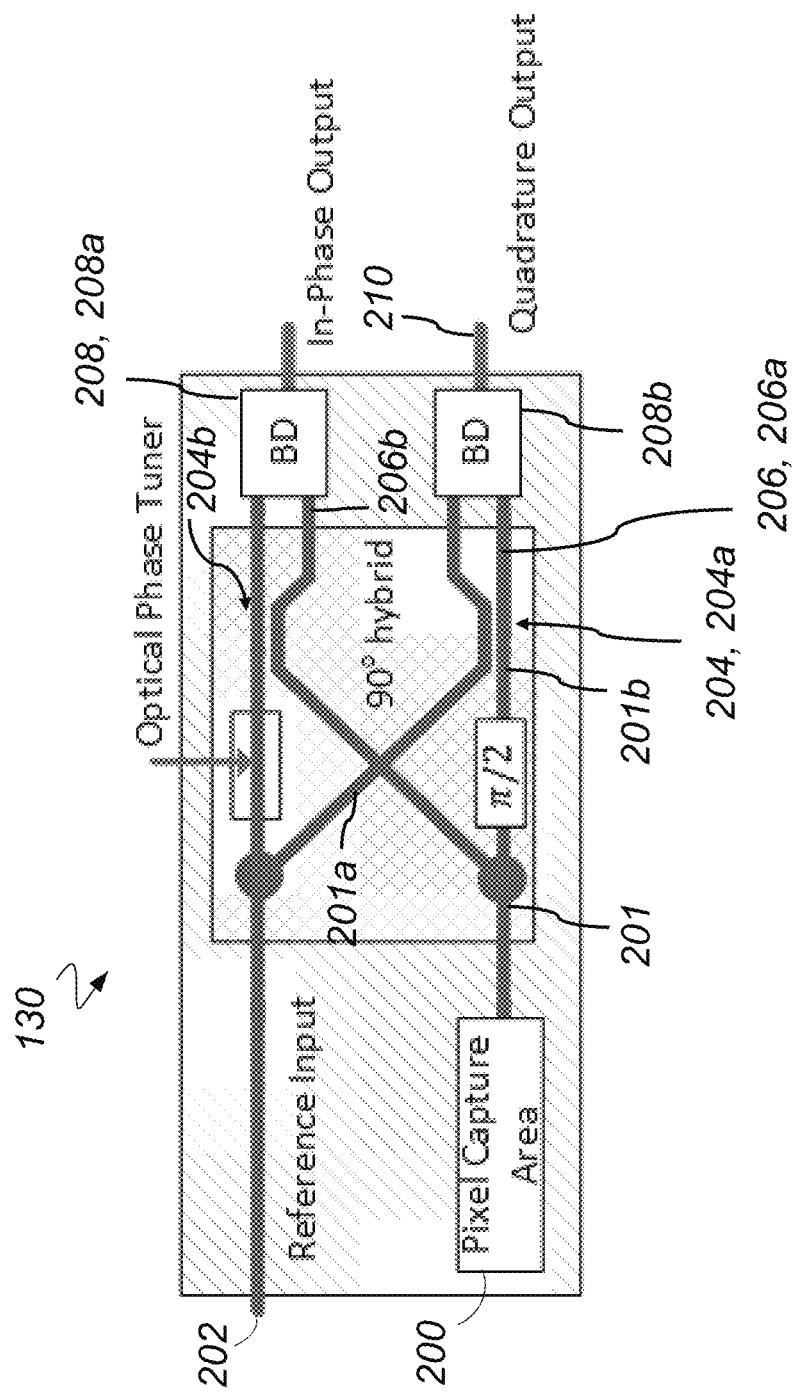
FIG. 2. Block diagram of a unit-cell in a detector array in the coherent imaging system.

FIG. 2 illustrates an example building block of the receiver array, comprising a coherent pixel 130 that can detect both phase and amplitude of the received signal 126. Each of the pixels comprise a capture area 200 (e.g., grating coupler or optical antenna) for collecting a portion of the signal beam imaged on the capture area by the image forming device 128, as a collected signal 201; and a plurality of waveguides 202 distributing the reference 112 and the collected signal 201, along a plurality of paths, to a plurality of couplers 204. The collected signals in different paths have different phase shifts and each of the couplers mix the reference with a different one of the collected signals having a different one of the phase shifts so as to form a plurality of mixed signals 206. In one or more embodiments, the image forming device 128 (e.g., an optical phased array) phase shifts the electromagnetic radiation 126 received from the target so that the collected signals in different paths have different phase shifts.

Each pixel further comprises a plurality of detectors 208 coupled to outputs of the couplers so as to detect each of the mixed signals and output a plurality of output signals 210 in response thereto. Thus, the mixing may have two or more (N=2, 3, 4, or more) outputs by splitting the reference 112 and pixel signals 201 into N paths and combining them with appropriate phase differences. In the case of N=2, the phase difference can be 90°. In the case of N=4, the phase differences can be 45°, 90°, and 135°, for example.

In the specific N=2 example illustrated FIG. 2, the pixel 130 splits and mixes the received signal 201 with the reference signal 112 in two paths. The two paths mix the reference signal 112 with the received signal 201 and are identical except with relative pixel (or reference) path difference comprising a quarter wavelength ($\pi/2$). This structure is known as 90° hybrid. As a result, the mixed optical signals are in-phase and quadrature components of each other. The in-phase and quadrature mixes are then fed into the optical detectors 208 to generate electrical down-converted signals. Thus, in one exemplary N=2 implementation, the couplers 204 comprise a first coupler 204a and a second coupler 204b; the collected signals 201 comprise a first signal 201a and a second signal 201b having the phase shift of 90 degrees relative the first signal; the mixed signals comprise a first mixed signal 206b and a to second mixed signal 206a; the first coupler mixes the first signal with reference to form the first mixed signal 206b comprising an in-phase signal; the second coupler mixes the second signal with the reference to form the second mixed signal 206a comprising a quadrature signal; and the detectors 208 comprise a first detector 208a detecting the in-phase signal and a second detector 208b detecting the quadrature signal. In the illustrated embodiment, the combining/mixing is achieved using directional couplers 204 and the detection is achieved using balanced detector 208 configured to subtract out the unmixed optical component. In other implementations, Y-junctions are used for signal combining with single photodetectors. Example couplers 204 include, but are not limited to, waveguide sections separated by a sufficiently small gap allowing coupling of electromagnetic fields associated with the collected signals between the waveguide sections, or beam splitters.

FIG. 2 illustrates an example wherein an optical phase tuner is incorporated in one of the paths to correct for fabrication imperfections that change the relative path to an undesirable phase (e.g., other than 90° for the implementation with N=2 paths).

In the case of a two electrical output pixel, the signal 201 and reference 112 path signals are given by:

$$E_{sig}(t)=\eta A_1(t)\cos(\omega_{opt}t+\phi_{opt}+P_1(t))$$

$$E_{ref}(t)=A_2(t)\cos(\omega_{opt}t+\phi'_{opt}+P_2(t))$$

where $A_1(t)$, $A_2(t)$, $P_1(t)$, and $P_2(t)$ are electrical modulations encoded on the optical signal, $\eta$ is the complex reflection or transmission coefficient of the target, $\omega_{opt}$ is the optical carrier frequency, and $\Phi_{opt}$ and $\Phi'_{opt}$ are the optical path phases which fluctuate with laser phase noise as well as changes in the optical path lengths. After combining using the coherent pixel 130, the electrical output currents are:

$$I_1=R\eta A_1(t)A_2(t)\cos(P_1(t)-P_2(t)-\delta\phi_{opt})$$

$$I_2=R\eta A_1(t)A_2(t)\sin(P_1(t)-P_2(t)-\delta\phi_{opt})$$

where R is the photodetector responsivity and $\delta\Phi_{opt}=\Phi_{opt}-\Phi'_{opt}$. Summing the square of the currents (SSQ) removes any dependency on the carrier phase difference $\delta\phi_{opt}$.

$$SSQ=I_1^2+I_2^2=(R\eta A_1(t)A_2(t))^2$$

In this way, the carrier frequency and all its noise contributions are suppressed.

In another embodiment, the optical phase noise is extracted for further processing. After computing SSQ, $P_1(t)-P_2(t)-\delta\Phi_{opt}$ can be extracted. If phase encoding is used, $P_1(t)\neq 0$, $P_2(t)\neq 0$, and $P_1(t)-P_2(t)$ can contain information about the target with laser phase noise behaving as additive noise on the signal.

Example Row-Column Readout and Expandable Aperture

In a planar N×M pixel array using a semiconductor platform (such as CMOS silicon photonics) implementing the coherent imaging unit, routing the output electrical signals to amplification and detection electrical circuitry can present electrical interconnect difficulties. These difficulties can be addressed by utilizing row-column select signals to enable a first set of pixels while disabling others, thereby only reading a subgroup of pixels at a time. The select signals could be implemented using CMOS switches included in the individual pixels, wherein each pixel includes a local first stage amplifier and the switching signal comprises the supply voltage of the amplifier. However, CMOS switches require implementation in an integrated photonics platform with integrated electrical transistor blocks, adding to the cost and complexity of implementing a large-scale aperture.

Figure 3:
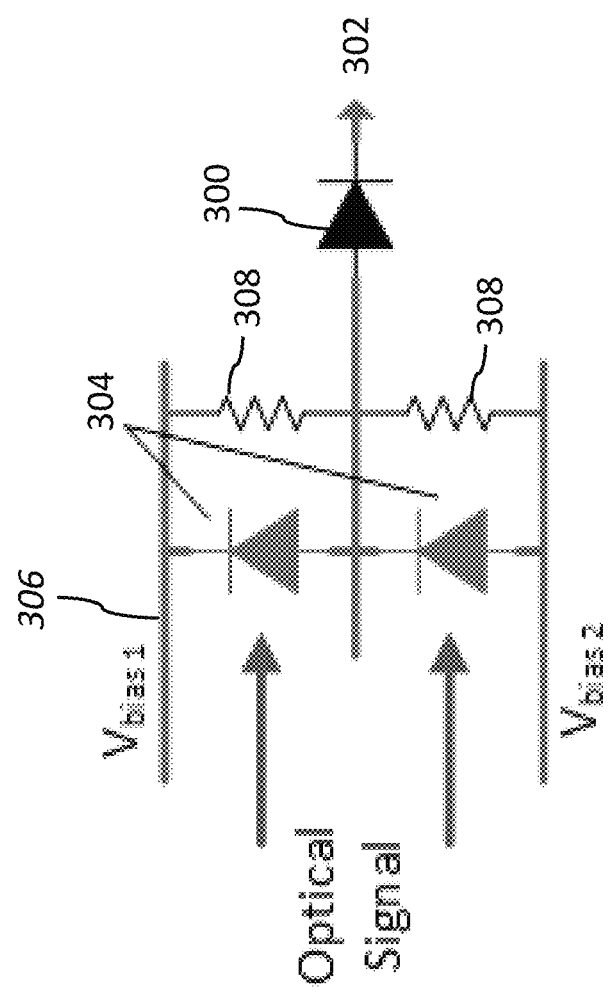
FIG. 3. Schematic of a balanced detector cell with diode select signal and parallel protection resistors.

To overcome these problems in a low-cost fashion, FIG. 3 illustrates an embodiment wherein the row-column readout circuit comprises an electrical diode 300 which can be readily implemented in an integrated photonics platform. More specifically, the circuit architecture comprises the diode 300 in series with the downconverted electrical output 302 of the balanced detectors 208, 304, so that each pixel is enabled for readout only when the series diode 300 is forward biased. The photonics detectors (photodiodes 304) are kept in reverse bias using bias nodes Vbias1 and Vbias2 applied along common bias lines 306. Two resistors 308 are placed in parallel with the detectors 208, 304 so that the resistors provide protection by preventing charge build-up on the optical detectors 208, 304.

Figure 4:
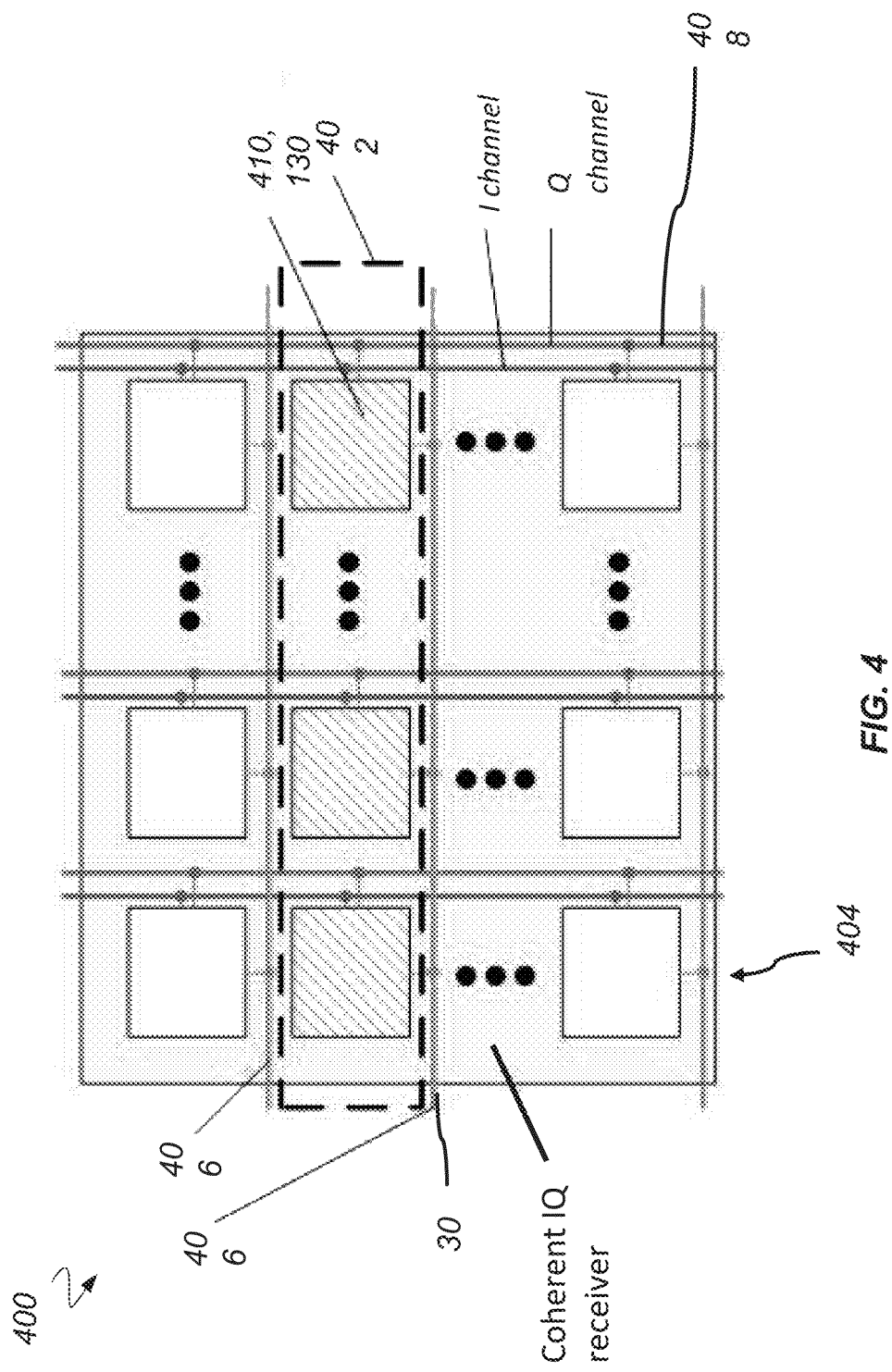
FIG. 4. Schematic illustrating electrical connection of coherent imager pixels.

FIG. 4 illustrates the row-column enable architecture 400 comprising the pixels 130 disposed in rows 402 and columns 404 in a rectangular grid, with common row signals 406 (Vbias1 and Vbias2) for reverse biasing the photodiodes 304 as well as setting the voltage of the series diode's 300 anode. All the pixels 130 in a given column 404 also share two common output voltages 408, comprising common read signal 1 (I channel) and column read signal 2 (Q channel). The bias voltage 408 sets the series diode's 300 cathode voltage for the column. Using this architecture for row-column read-out operation, it is possible to forward bias the series diodes of one row of these pixels 130 in forward bias, so as to select active pixels 410, and disable all the remaining rows of pixels 130 by reverse biasing the series diodes 300 in those remaining rows. In this way, the column nodes only contain current from the enabled row and only 2N signals and 2N amplifiers are required for full array readout from an array of N×N pixels.

In some examples, depending on the technology utilized and the size of the imager array, this row-column architecture is not required. For example, in another embodiment, the electrical connections are arranged such that several rows can be read simultaneously with additional column signals.

Example Reference Light Distribution to Individual Pixels

FIG. 1 illustrates the reference light 112 distributed to all the pixels in the array for proper operation of the coherent imaging system. In one embodiment, this distribution is achieved using an equal power 1:N optical splitter or a cascade of 1:2 or 1:M splitters.

Utilizing a tunable optical distribution network is beneficial for improved row-column signal isolation because the row-column select diode 300 from the disabled rows may, in some implementations, permits a small amount of signal leakage. As a result, for a very large array, the disabled rows accumulate a current leakage that can interfere with the row that is active and consequently reduce the dynamic range of the pixels. With a tunable optical distribution network, it is possible to reduce the undesired signal intensity to acceptable levels.

In one or more examples, the tunable optical distribution network can be used to provide a row-column select signal. In such examples, the distribution network is configured to control distribution of local oscillator power (the reference 112) so that only one or more selected rows receives LO power (effectively turning off the remaining rows). However, in some examples (similar to electrical row-column diodes), the optical distribution is imperfect and only has a certain dynamic range. Thus, a combined tunable optical power distribution (TPD) network in conjunction with a row-column diode read-out circuit may enable utilization of much larger arrays with reduced pixel to pixel interference and higher signal dynamic range.

Figure 5:
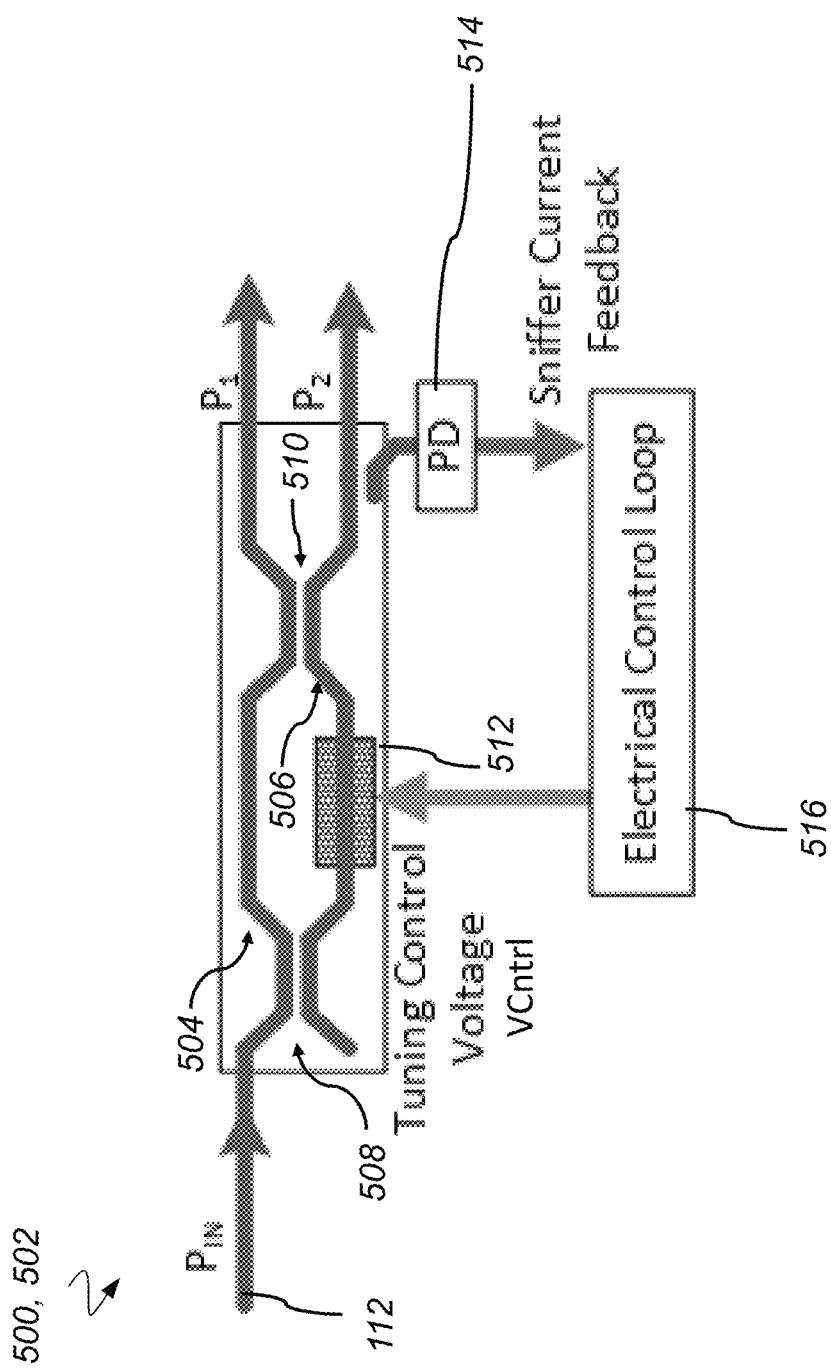
FIG. 5. Schematic of a. Tunable Optical power Distribution (TPD) cell for 1 to 2 power splitting.

FIG. 5 shows an embodiment wherein the tunable power distribution (TPD) utilizes a tunable Mach Zehnder Interferometer 502 based power splitter. The relative phase of the two paths 504, 506, controlled using a voltage V Cntrl biasing a modulator 512, determines the relative power of the two output ports $P_1$, $P_2$. A sniffer photodiode 514 is used to measure a fraction of the power at the output of one of the ports $P_1$ or $P_2$. Knowledge of the total input power $P_{in}$, in conjunction with the current $I_{FBk}$ outputted from the sniffer diode 514 coupled to the $k^{th}$ interferometer 502, enables calculation of the output power at each output port and stabilization of the output power to a desired value (using an electrical feedback loop 516).

Figure 6:
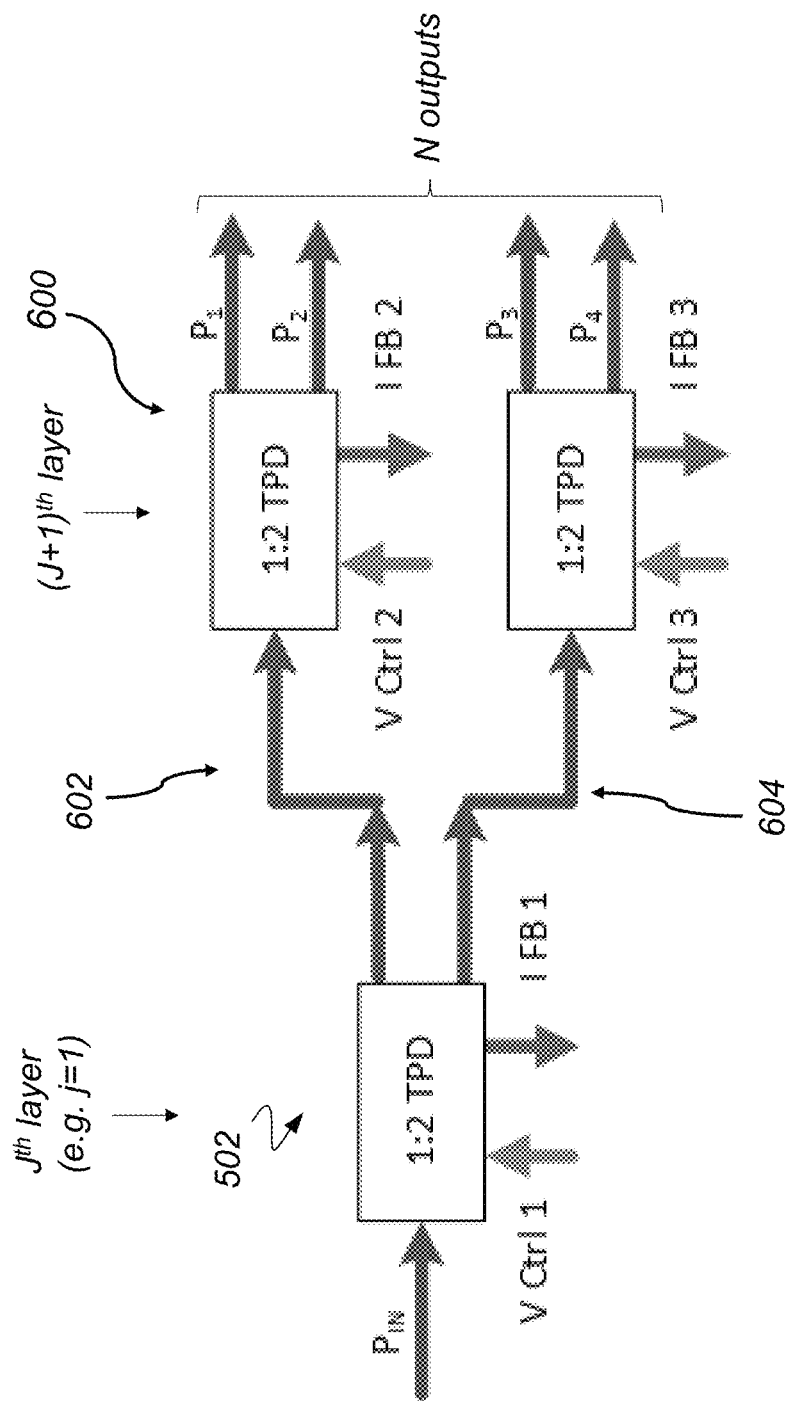
FIG. 6. Cascade of TPD cells for 1 to 4 power splitting.

FIG. 6 illustrates an example where power distribution units TPD, 500, 502 are cascaded to create a tunable optical coupler splitting one port to four ports. FIG. 6 shows that, for a 1:4=$2^2$ splitter, only two current nodes $I_{S1}=I_{FB1}$ and $I_{S2}=I_{FB2}+I_{FB3}$ are required for full calibration of the tunable coupler (where $I_{FB1}$, $I_{FB2}$, $I_{FB3}$ are the currents outputted from sniffer diodes 314 coupled to each of the three interferometers 502). The calibration scheme comprises a first step directing all the optical power to the top branch 602 of the network, and noting the associated voltage Vctrl1 applied to the modulator 512 and the resulting $I_{S1}$ used to monitor the optical power. Then, in a second step, Vctrl2 applied to the second modulator 512 in the second interferometer 502 is calibrated by adjusting Vctrl2 to achieve various power ratios at the outputs in the top branch and noting the measured IR. Afterwards, in a third step, Vctrl1 is set to direct all the power to the lower branch 604 and the $I_{S2}$ current (together with $I_{S2}$ obtained in the second step) are used to calibrate Vcntrl3 applied to the third modulator 512 in the third interferometer 502.

Figure 7:
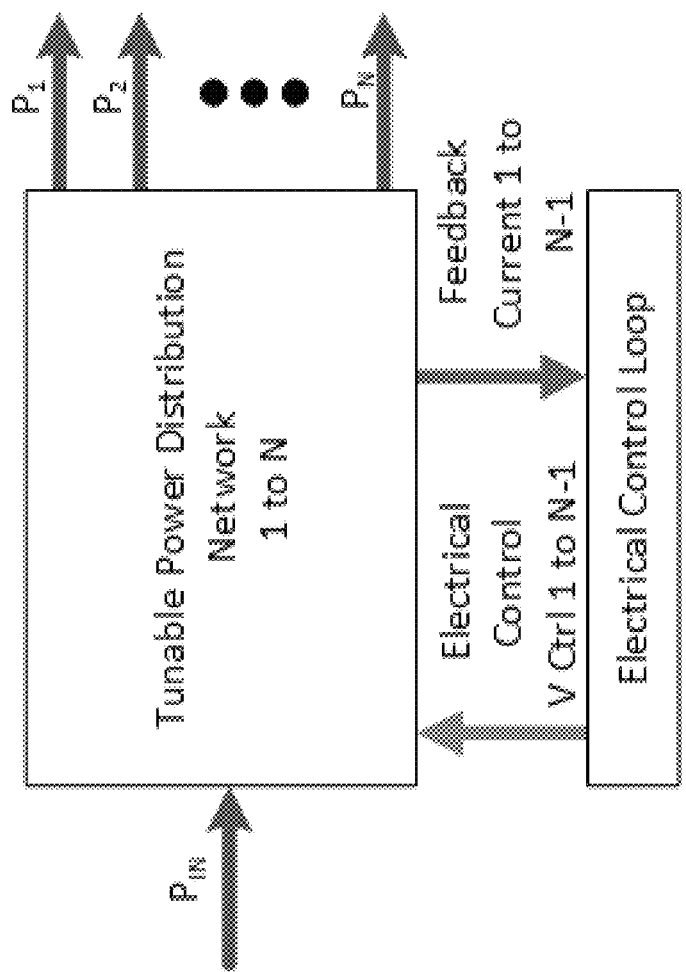
FIG. 7. Cascade of TPD cells for 1 to N power splitting.

FIG. 7 illustrates an embodiment where the tunable couplers 500 are cascaded to create a 1:N=$2^M$ tunable power splitter. More generally, the voltage signals (e.g., VCntrl 1 . . . V Cntrl k) required for allocating the power to the N=$2^M$ outputs are calibrated for M layers 600 of the power distribution TPD circuits 500, for each of the TPD circuits in the j layers 1≤j≤M, starting with j=1, by
  (a) recording the voltage signals (e.g., VCtrl 1 . . . V Cntrl k) applied to each of the k interferometers in the $j^{th}$ layer, and the sum of the currents (e.g., $I_j=\Sigma_k\ IFB_k$) outputted from all the k interferometers in the $j^{th}$ layer, when routing all the power to a top most branch 602 and a bottom most branch 604 in the $(j+1)^{th}$ layer; and
  (b) adjusting the voltage signals (e.g., VCntrl p) to the p interferometers 502 in the $(j+1)^{th}$ layer and noting the sum of the current signals (e.g., $I_{j+1}=\Sigma_p\ I\ IFBp$) outputted from all the p interferometers in the $(j+1)^{th}$ layer when routing different powers of the reference to each of the remaining outputs in the $(j+1)^{th}$ layer, taking into account knowledge obtained in (a); and
  such that all the voltage signals (e.g., V Cntrl k, V Cntrl p) are calibrated using only a number M of current nodes, wherein the $j^{th}$ current node comprises the sum of the current signals $I_j=\Sigma_k\ I_k$ outputted from the $j^{th}$ layer and k is the number of TPD circuits in the $j^{th}$ layer.

Example Transmitter and Receiver Beamforming Configurations.

The array of coherent imaging pixels 130 in the receiver 103 operates in conjunction with the transmitter 102 that illuminates the target 122 and a beamforming 128 element that forms an image on the pixels 130.

Figure 8:
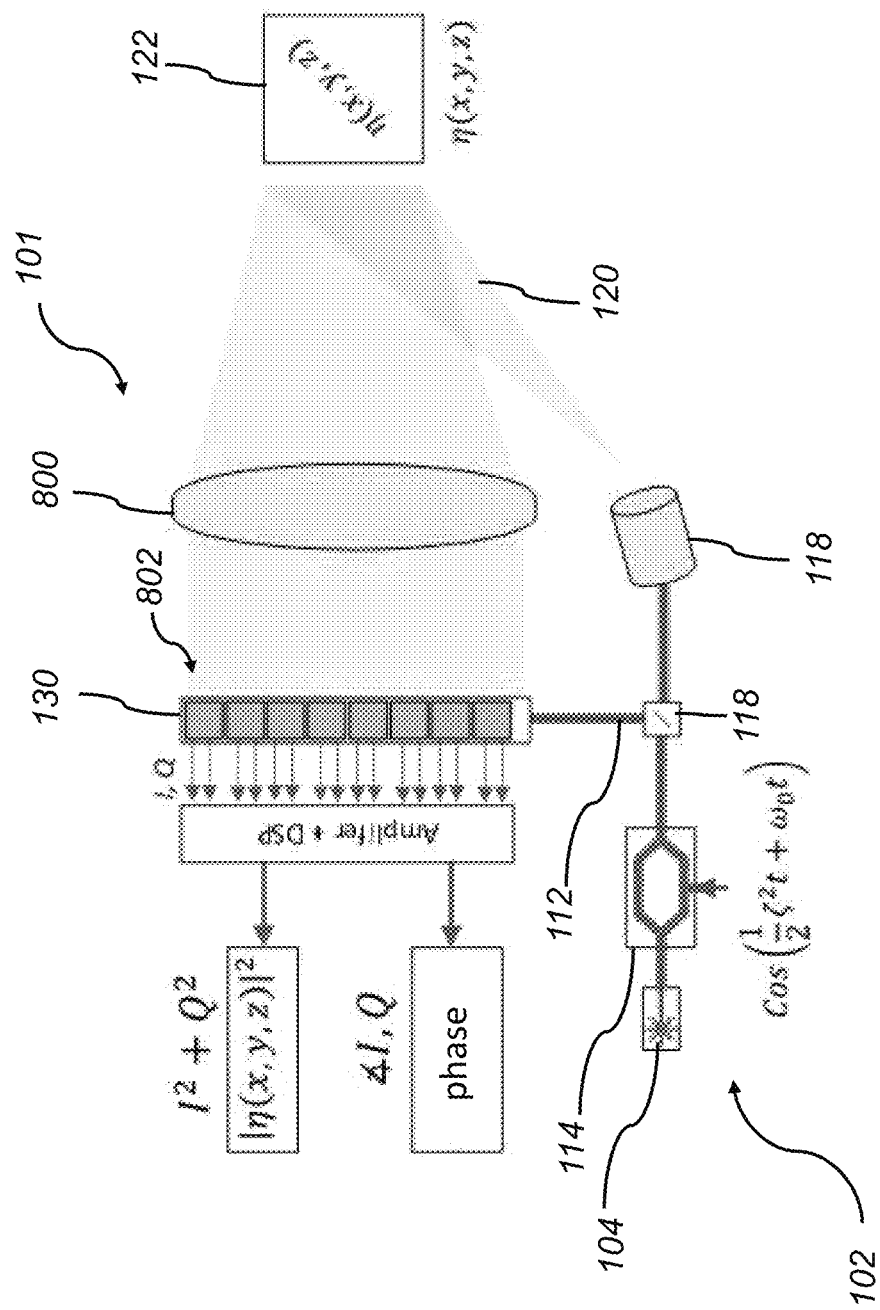
FIG. 8. Coherent imaging system with frequency modulation continuous wave (FMCW) modulation, flash illumination, and image formation using a discrete lens.

FIG. 8 illustrates an example wherein the transmitter 102 outputs laser light comprising a signal $\cos(\omega_{opt}+\Phi_o)$ modulated with a frequency modulated continuous wave (FMCW) chirp, using a modulator applying signal $\cos((1/2)\xi^2 t+\omega_o t)$. Flash illumination 118 irradiates an entirety of the target 122 with the FMCW modulated signal beam 120. A fraction of that optical power is modulated by the target 122 according to a reflection or transmission function $\eta(x,y,z)$. The remaining modulated light is tapped off using a beam splitter 801 and used as a coherent source for the reference 112 inputted to the receiver's array of pixels 130. In the example of FIG. 8, the light reflected from the target 122 is collected using a lens 800 forming an image on the receiver's detector array 802 (comprising pixels 130). Amplification and digital signal processing (DSP) using a circuit 132 allow measurement of the intensity $I^2+Q^2=\eta(x,y,z)$, phase $(\Delta\Phi+\omega_{opt}\tau(\eta))$ of the signal beam 126 so as to determine depth information of the target 122. While this technique comprises one of the fastest methods to image a target, the limit on total radiated power per wavelength limits the total illumination power per point on the target.

Figure 9:
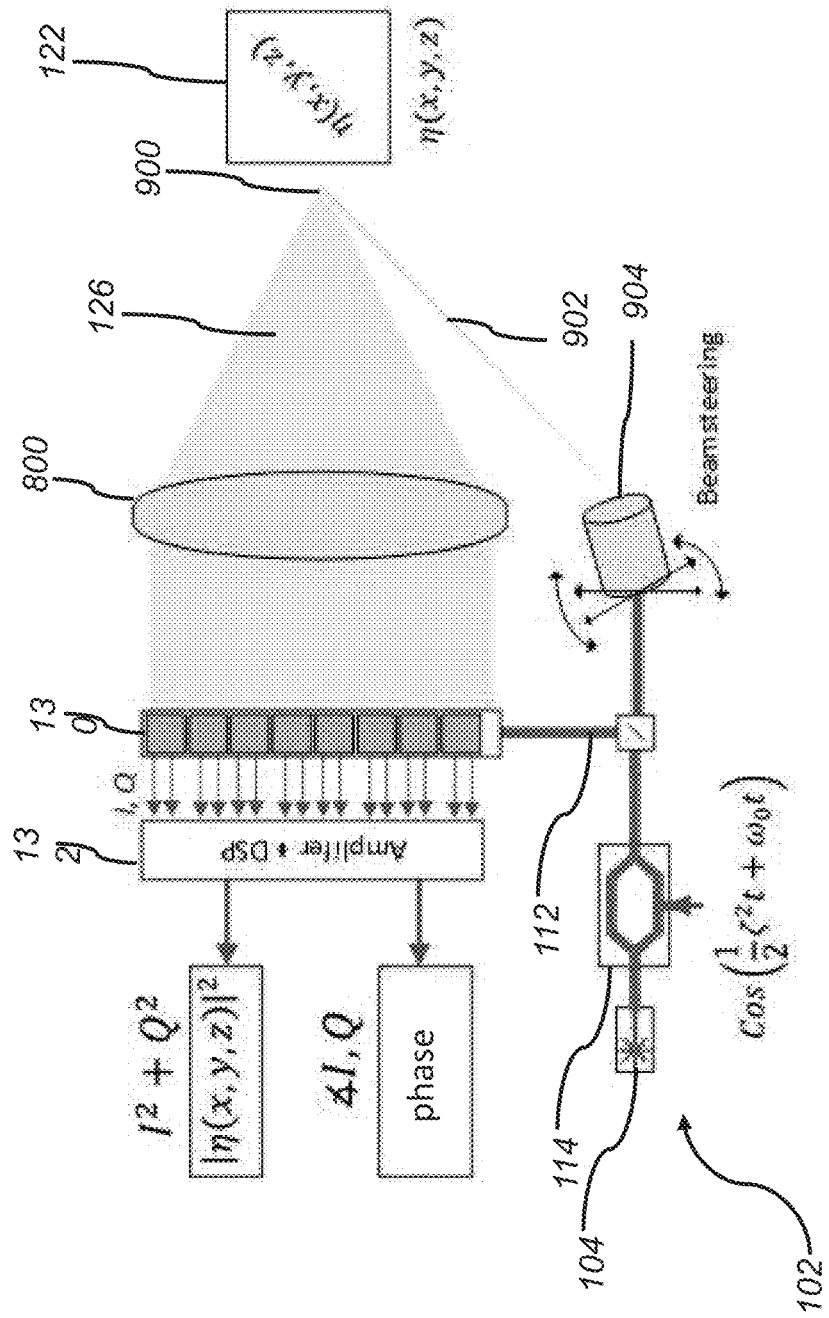
FIG. 9. Coherent imaging system with FMCW modulation, point-by-point illumination, and image formation using a discrete lens.

FIG. 9 illustrates another embodiment wherein the transmitter 102 illuminates the target 122 point-by-point 900 using a collimated beam 902 (modulated with a FMCW chirp as in FIG. 8). The illumination beam 902 is steered either mechanically or electrically using a beam steerer 904 comprising a solid-state phased-array. The light 126 reflected from the target is collected using a lens 800 and the image is formed on the receiver's detector array 802 (comprising pixels 130). This method increases the signal sensitivity, limits the maximum allowable illumination per wavelength, focuses all the power on a single point, and offers maximum signal to noise ratio (SNR) at a cost of high image capture speed.

Figure 10:
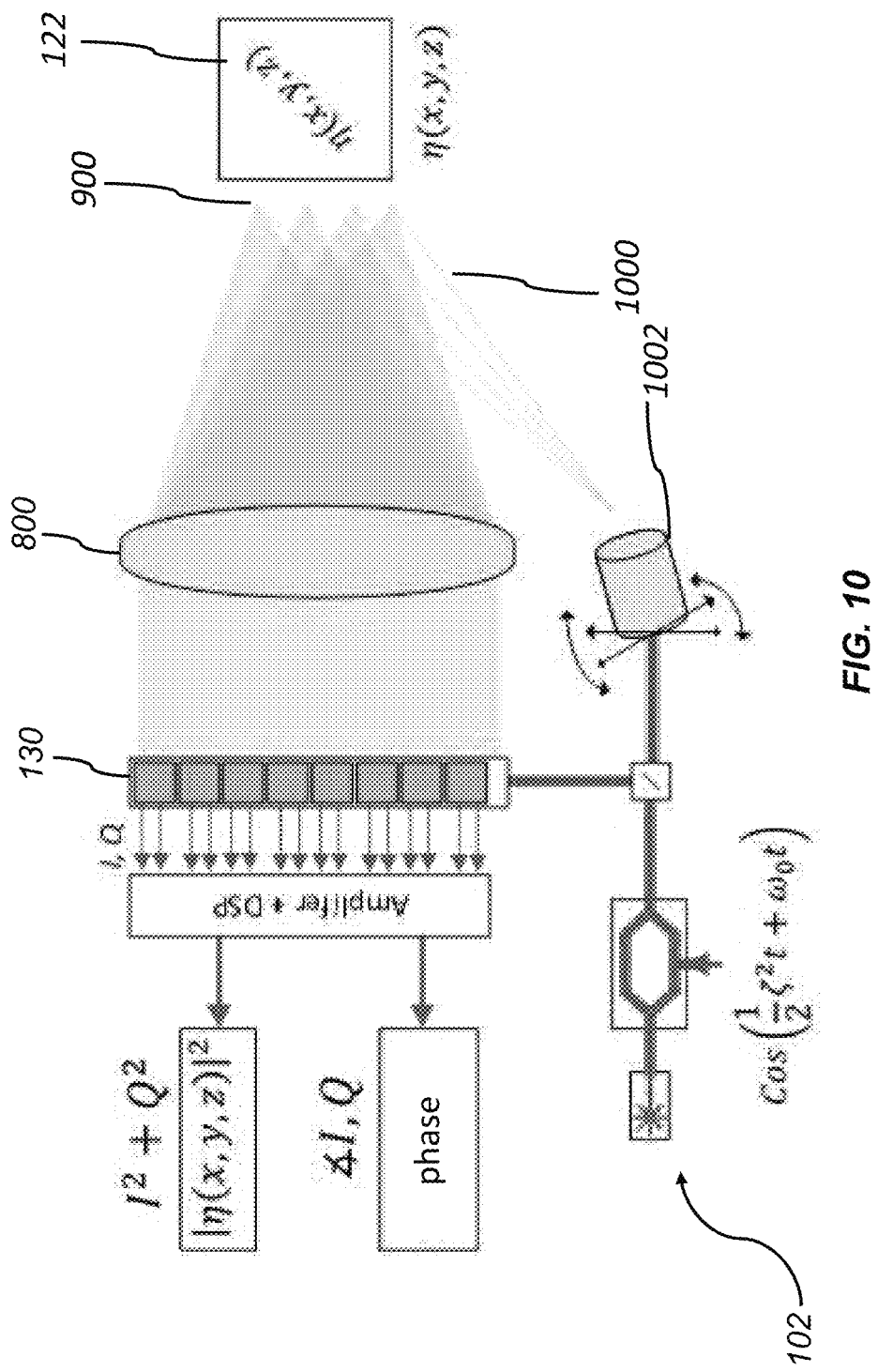
FIG. 10. Coherent imaging system with FMCW modulation, point-by-point illumination, and image formation using a discrete lens.

FIG. 10 illustrates yet another embodiment wherein the transmitter 102 irradiates the target 122 at multiple points 900 using multi beam illumination 1000. In various examples, the multi-beam irradiation 1000 is generated and scanned across the target 122 using beam steering 1004, comprising a mechanical beam steerer, a diffraction grating, or solid state beam forming (e.g., an optical phased array with greater than half-wavelength spacing). The multiple points 900 of illumination are reflected so that an image is formed using a lens 800 (or other image forming device) on the coherent imaging pixels 130. This embodiment offers a trade-off between the two methods of FIG. 8 and FIG. 9 and simplifies the transmitter beamforming requirements.

Figure 11:
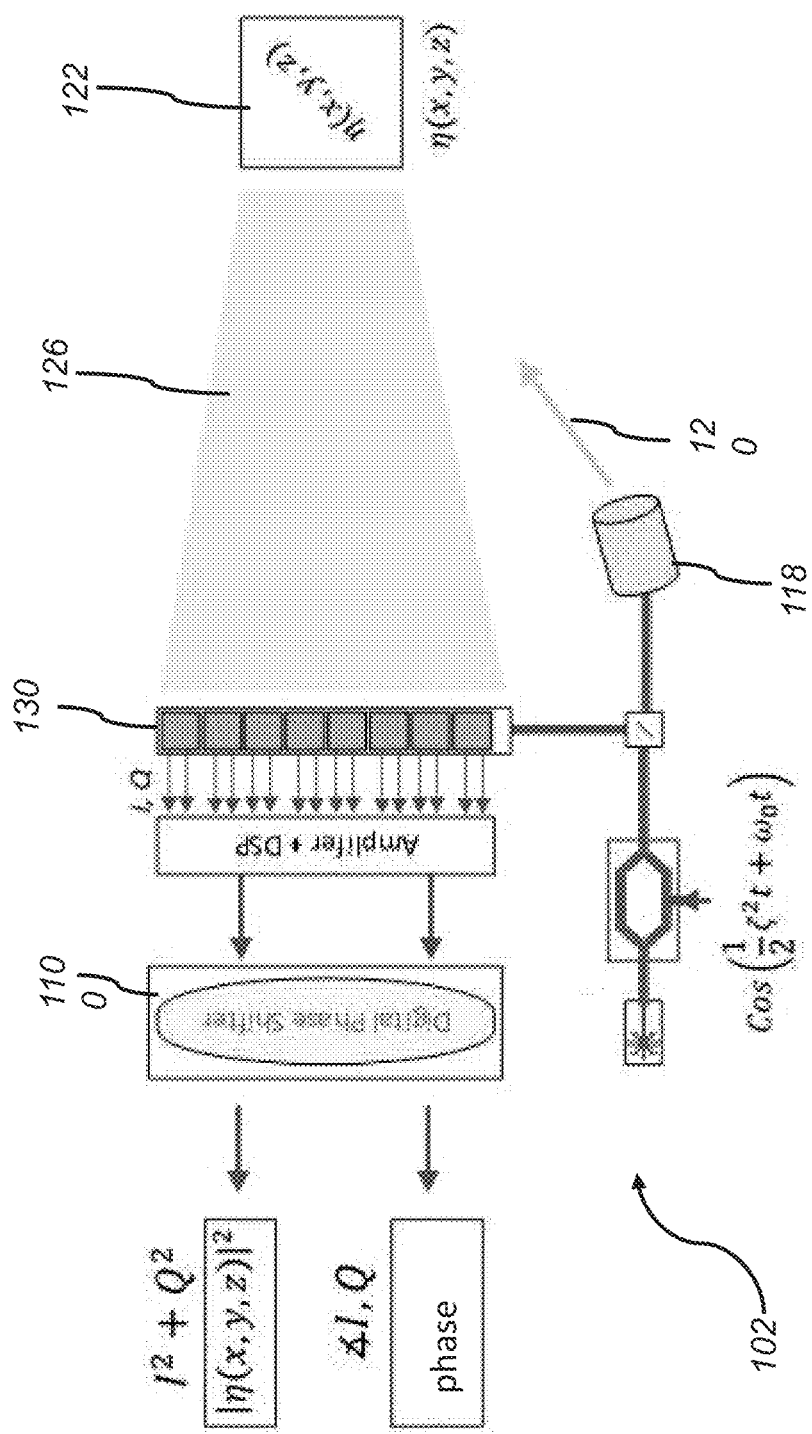
FIG. 11. Coherent imaging system with digital beamforming.

FIG. 11 illustrates an example wherein the image is formed in the digital domain by adjusting the relative phase of the in-phase I and quadrature Q signals between different pixels 130 in the digital domain (using a digital phase shifter array 1100 with digital beamforming capability). This system embodiment has increased compactness as compared to the system embodiments illustrated in FIGS. 8-10.

Exemplary Modulation Schemes for High Dynamic Range-Resolution Depth Imaging

Although FIGS. 8-11 illustrate a signal beam modulated with a FMCW chirp, other modulation schemes (or no modulation) may be used. The modulation scheme of the reference and illumination paths determines the depth resolution and the dynamic range of the depth measurement. Basic amplitude modulation using FMCW signals has desirable dynamic range whereas RF phase measurements are characterized higher resolution but poor dynamic range. In one or more embodiments using a combination of phase RF modulation and FMCW amplitude modulation, the coherent imaging system achieves both desirable high dynamic range as well as high resolution.

Some modulation schemes can simultaneously generate both distance and velocity information for the imaging target. In the case of a matched filter used for temporal distance measurement, broadening of the spectrum allows light return from multiple targets at different distances, which can lead higher accuracy scene reconstruction.

Example Optical Phased Array

Figure 12:
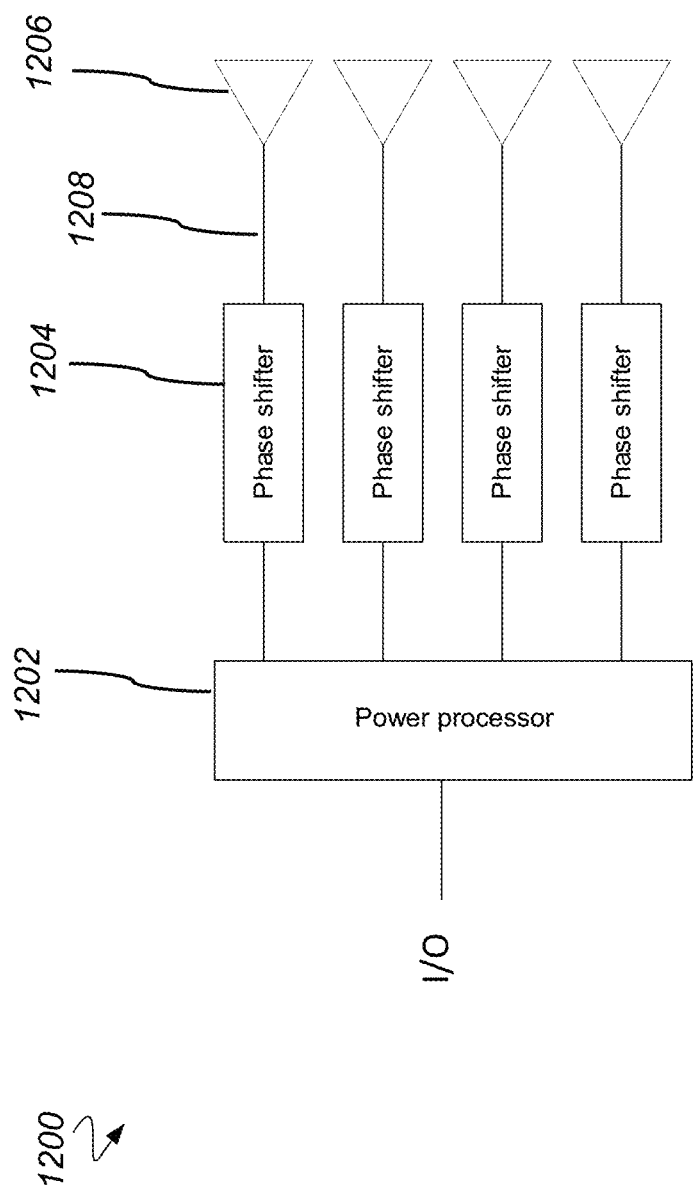
FIG. 12. Schematic illustration of optical phased array for beamforming or image forming.

FIG. 12 illustrates an example (e.g., optical) phased array 1200 for beamforming 118 and/or image forming 128 in the coherent imaging system. The optical phased array 1200 comprises an input or output I/O; a power processor 1202 (e.g., power splitter or combiner); optical phase shifters 1204; radiating or receiving elements 1206 (e.g., optical antennas); and waveguides 1208 connecting the elements 1206 to the I/O via the power processor 1202 and the optical phase shifters 1204.

Example phase shifters include, but are not limited to, devices comprising materials coupled to one or more electrodes biased using phase shifter circuits, wherein a voltage applied to the electrodes via the phase shifter circuits apply an electric field to the materials and the electric field modulates a refractive index of the material and thus a phase of the electromagnetic radiation transmitted through the material. In one or more examples, the phase shifters comprise electro-optic modulators whose refractive index is modulated via the electro-optic effect.

Example power combiners and splitters include, but are not limited to, junctions between waveguides (e.g., Y junctions).

In one example, the I/O device includes a laser or fiber connected to a laser or laser array, when the optical phased array is being implemented as a beamforming device 118 in the transmitter 102. In another example the I/O device comprises an antenna or fiber coupler for coupling electromagnetic radiation 126, when the optical phased array 1200 is being implemented as an image forming device 128 receiving the signal beam from the target).

Other example beamforming and image forming devices include, but are not limited, to mechanical beam steerers (e.g., mirrors mounted to mechanical mounts such as gimbals), electro-optic beam steerers (e.g., comprising liquid crystals or other materials controlling a direction of electromagnetic radiation through an electro-optic effect), micro electromechanical systems (MEMS) devices, digital micromirror devices (DMDs), or spatial light modulators.

In one or more embodiments, the phase shifters phase shift the electromagnetic radiation 126 received from the target so that the collected signals 201 in the different paths in the pixels 130 have different phase shifts.

Working Example Implemented with Silicon Photonics

FIGS. 13A, 13B, 13C, and 14 illustrate a silicon photonics implementation of an 8×8 array of in-phase and quadrature pixels 130 with integrated thermal phase tuners for adjusting to fabrication mismatches.

FIG. 13A is a Scanning Electron Microscope (SEM) image of a tunable power distribution cell comprising an interferometer 502, showing the first branch 504; the first coupler 508; the second branch 506; the second coupler 510; and the sniffer photodiode 514.

FIG. 13B is an SEM image of a pixel 130 showing the capture area 200; waveguides 202; couplers 204; and balanced photodiodes 208. FIG. 13C is a close up of FIG. 13B showing the 90° hybrid mixer.

Figure 14:
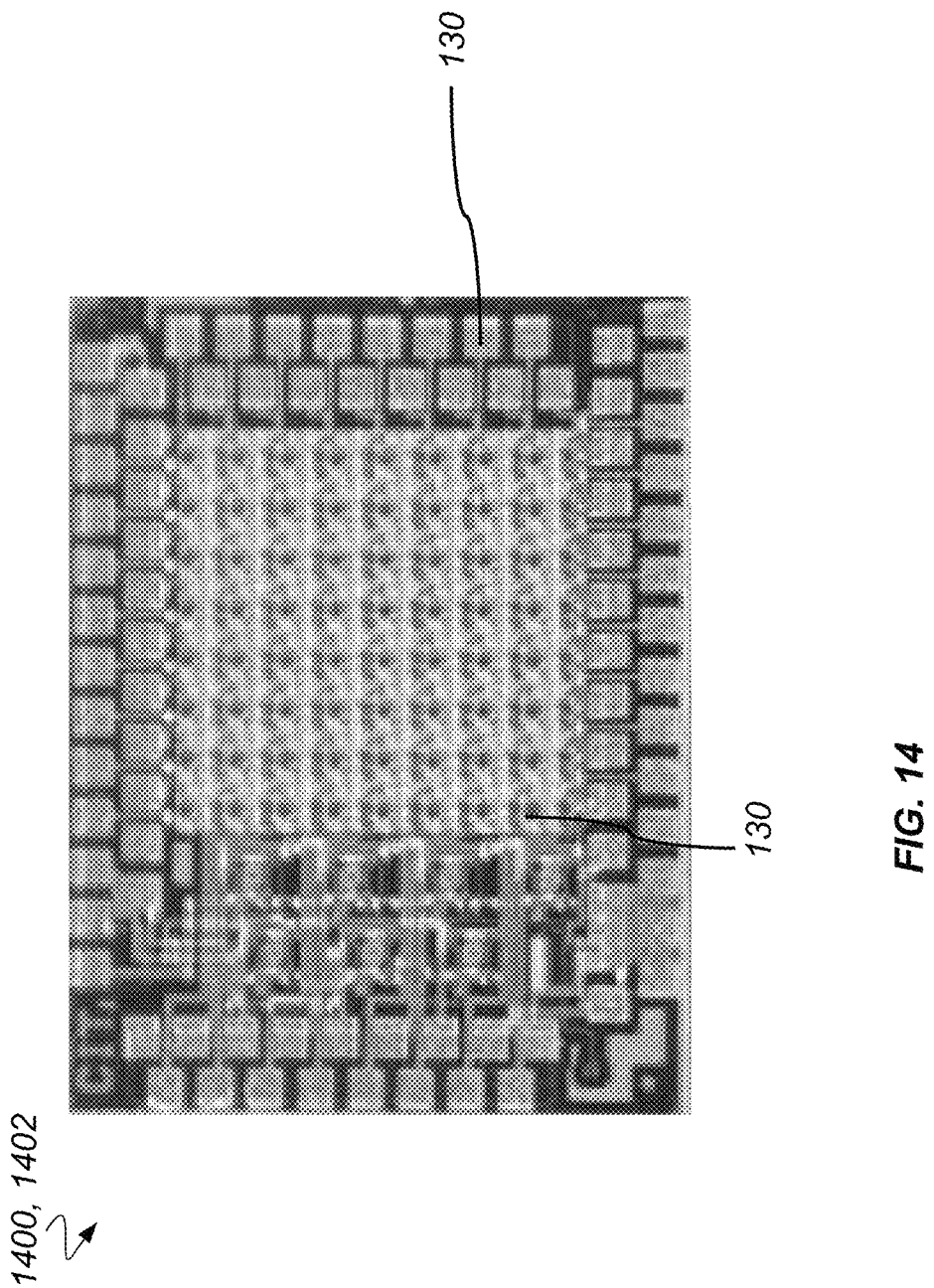
FIG. 14. Die photo of a silicon photonics implementation of the coherent imager.

FIG. 14 is a die photo of the chip 1400 comprising a detector array 1402 of 8×8 pixels 130 and contacts 1404 for applying bias voltages for reading the pixels and receiving the output signals 210 from the pixels 130. The array 1402 comprises row-column read-out architecture with 16 output currents for 16 columns. The chip 1400 further comprises an 1:8 tunable amplitude distribution network of cells 502 controlling distribution of LO reference 112 to the pixels 130 in the array 1402.

Figure 13:
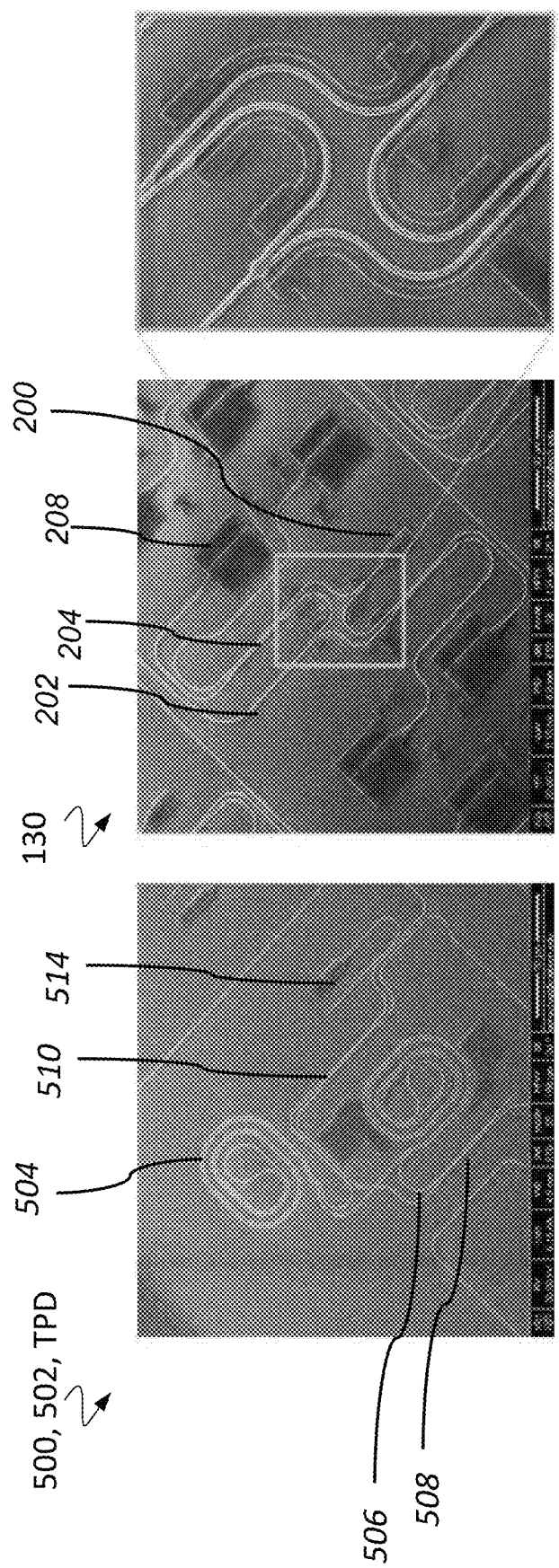
FIGS. 13A-13C. Scanning Electron Microscope (SEM) images of a tunable coupler (FIG. 13A), coherent imager pixel unit (FIG. 13B), and hybrid 90° coupler (FIG. 13C) fabricated as a photonic circuit using photolithography in silicon.
Figures 15A, 15B:
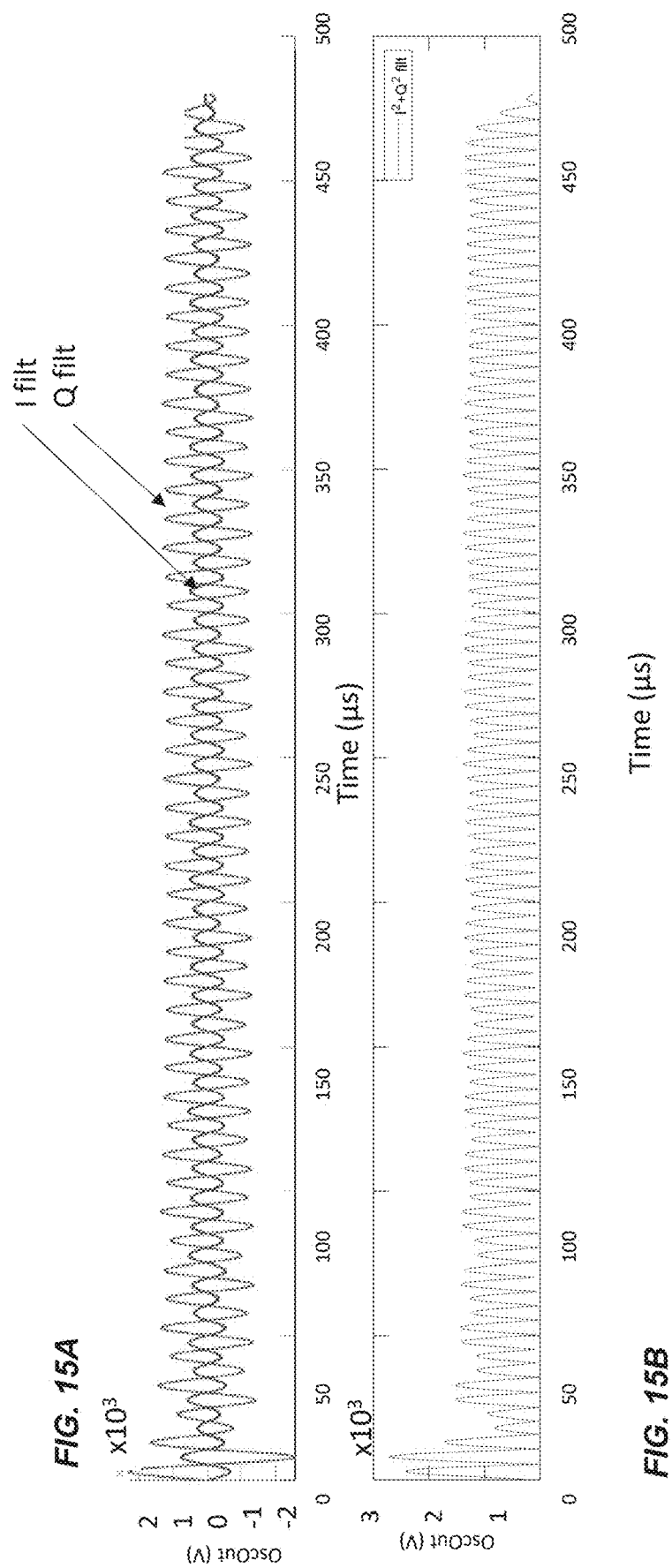
FIG. 15A. Plot of measured in phase signal (I) and out of phase signal (Q) as a function of time (in microseconds µs), at a first time instance, in response to signal beam reflected from a target, obtained using the coherent imaging system of FIGS. 1, 13, and 14.
FIG. 15B. Plot of $I^2+Q^2$ using I and Q in FIG. 15A.
Figures 16A, 16B:
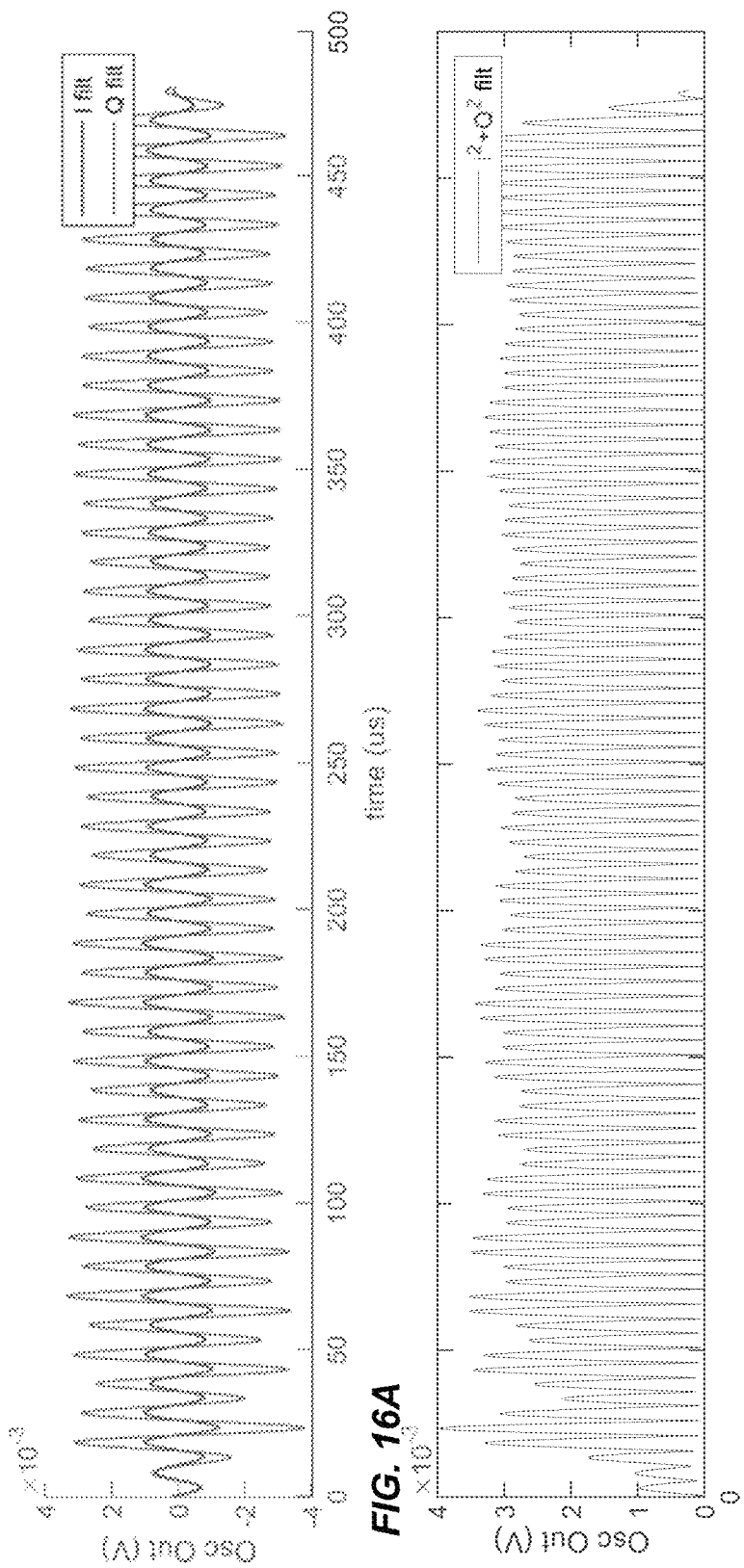
FIG. 16A. Plot of measured in phase signal (I) and out of phase signal (Q) as a function of time (in microseconds), at a second time instance, in response to signal beam reflected from a target, obtained using the coherent imaging system of FIGS. 1, 13, and 14.
FIG. 16B. Plot of $I^2+Q^2$ using I and Q in FIG. 16A.

The coherent imaging system 100 comprising the detector array 1402 and TPD illustrated in FIGS. 13-14 was tested using reference and illumination paths amplitude modulated with an RF signal and with a frequency difference of 100 kHz. FIG. 15 and FIG. 16 show the output signals from a single pixel 130 captured for both in-phase (I) and quadrature (Q) channels at two different time instances and with different path phase mismatch. Both channels show the down-converted signal at 100 kHz and at no instance do the laser and phase fluctuations result in zero output signal in both of the two paths.

Process Steps

Figure 17:
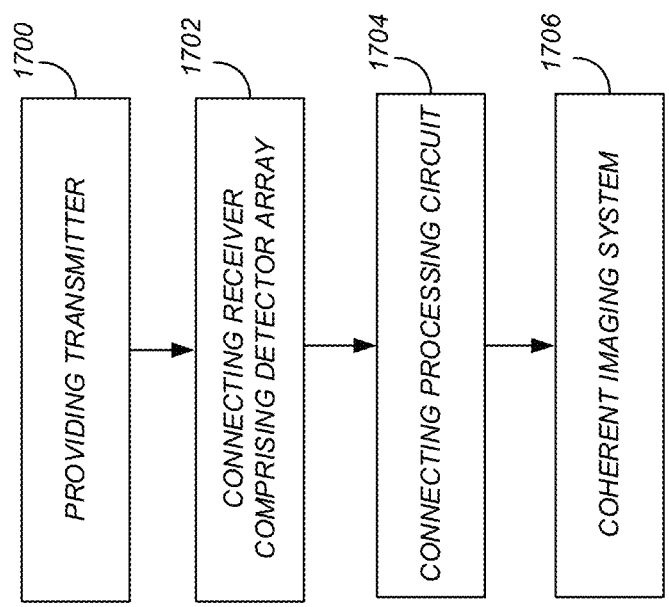
FIG. 17. Flowchart illustrating a method of making a coherent imaging system, according to one or more embodiments of the present invention, FIG. 18. Flowchart illustrating a method of imaging according to one or more embodiments of the present invention.

FIG. 17 is a flowchart illustrating a method of making a coherent imaging system 100 (referring also to FIGS. 1-15 and 19-20).

Block 1700 represents providing a transmitter 102 comprising a coherent source 104 of electromagnetic radiation 106 and a power splitter 108 for splitting the electromagnetic radiation into a signal beam 110 and a reference beam 112. In one or more heterodyne examples, the transmitter further comprises a modulator 114 for modulating at least one of a phase or an amplitude of the electromagnetic radiation, so as to form the signal beam 110 comprising modulated electromagnetic radiation 116. In a homodyne example, a modulator may not be required.

The transmitter 102 may further optionally comprise a beamformer 118 configured and positioned to transmit the signal beam 120 to a target 122. In another example, the transmitter comprises an illuminator or flash irradiating the target with the electromagnetic radiation without beamforming.

Block 1702 represents providing and positioning a receiver 103 to receive the signal beam 126 that has interacted with the target (e.g., reflected from, or transmitted through, the target). The step comprises providing the receiver 103 comprising an image forming device 128 coupled to an array of pixels 130. Each of the pixels 130 comprise means for collecting (e.g., capture area 200) at least a portion of a signal beam imaged on the pixel by the image forming device 120, as a collected signal; means for splitting/distributing (e.g., splitters and/or waveguides 202) the collected signal into a plurality of collected signals each having different phase shifts; means for mixing (e.g., couplers 204) each of the collected signals with a reference beam so as to form a plurality of mixed signals; and means for outputting (e.g., detectors 206) a plurality of output electrical signals in response to the mixed signals.

Block 1704 represents optionally providing and connecting a circuit 132 or circuitry for amplifying the output signals for further processing.

Block 1706 represents the end result, a coherent imaging system 100. The coherent imaging system can be embodied in many ways including, but not limited to, the following (reference numbers referring to FIGS. 1-20).

1. A coherent imaging system 100, comprising:
a transmitter 102 comprising a coherent source 104 of electromagnetic radiation 106; a power splitter 108 for splitting the modulated electromagnetic radiation into a reference 112 and a signal beam 110; and a receiver 103 positioned to receive the signal beam 126 reflected from, or transmitted through, the target. The receiver comprises an image forming device 128; and an array of pixels 120. In one or more embodiments, each of the pixels comprise a capture area 200 for collecting a portion of the signal beam imaged on the capture area by the image forming device, as a collected signal 201; and a plurality of waveguides 202 distributing the reference and the collected signal, along a plurality of paths, to a plurality of couplers 204. The collected signals in different paths have different phase shifts and each of the couplers mix the reference with a different one of the collected signals having a different one of the phase shifts so as to form a plurality of mixed signals 206. Each pixel further comprises a plurality of detectors 208 coupled to outputs of the couplers so as to detect each of the mixed signals and output a plurality of output signals 210 in response thereto. In one or more further embodiments, the array of pixels 130 comprises the detector array of examples 23 or 24 or 29 or 30.

2. The coherent imaging system of example 1, wherein the couplers 204 comprise a first coupler 204a and a second coupler 204b; the collected signals 201 comprise a first signal 201a and a second signal 201b having the phase shift of 90 degrees relative the first signal; the mixed signals comprise a first mixed signal 206b and a second mixed signal 206a; the first coupler mixes the first signal with reference to form the first mixed signal comprising an in-phase signal; the second coupler mixes the second signal with the reference to form the second mixed signal comprising a quadrature signal; and the detectors 208 comprise a first detector 208a detecting the in-phase signal and a second detector 208b detecting the quadrature signal.

3. The coherent imaging system of example 1 or 2, wherein the circuit sums 132 the squares of the output signals 210 (e.g., the output signals comprise currents and the circuits sums the squares of the currents $I_1, I_2, \ldots I_n$ to form $SSQ = I_1^2 + I_2^2 + \ldots + I_n^2$.

4. The coherent imaging system of examples 1 or 3, wherein the collected signals 201 comprise a first signal, a second signal having the phase shift of a first angle (e.g., 45°) relative to the first signal; a third signal having the phase shift of a second angle (e.g., 90°) relative to the first signal; and a fourth signal having the phase shift of a third angle (e.g., 135°) relative to the first signal; the couplers 204 comprise a first coupler, a second coupler, a third coupler, and a fourth coupler outputting the mixed signals 206 comprising a first mixed signal, a second mixed signal, a third mixed signal, and a fourth mixed signal; and the detectors 208 comprise a first detector detecting the first mixed signal, a second detector detecting the second mixed signal, a third detector detecting the third mixed signal, and a fourth detector detecting the fourth mixed signal.

5. The coherent imaging system of any of the examples 1-4, wherein each of the detectors 208 comprise a pair of balanced detectors (BD), e.g., for extracting the in-phase or out of phase component.

6. The coherent imaging system of any of the examples 1-5, wherein the transmitter's aperture 134 and the receiver's aperture 136 are the same, or the transmitter aperture and the receiver aperture can be one and the same. The transmitter aperture comprises the total surface area of the transmitter (e.g., total surface area of the beamformer 118)

outputting the signal beam 120 to the target, and the receiver aperture comprises the total surface area of the receiver (e.g., total surface area of the image forming device 128) capturing the signal beam 126 received from the target.

7. The coherent imaging system of any of the examples 1-6, wherein the transmitter's aperture and the receiver's aperture comprise or share the same optical antennas for both transmitting and receiving the signal beam.

8. The coherent imaging system of any of the examples 1-7, wherein the transmitter's aperture and the receiver's aperture comprise or share the same optical beamforming system (e.g., physical lens, optical phased array) for beamforming of the signal beam during transmitting and receiving of the signal beam.

9. The coherent imaging system of example 1, wherein the receiver further comprises an electrical control circuit 138, the electrical control circuit biasing the pixels 130 with a row enable signal 402 so as to select readout of the output signals from one or more selected rows 404 of the pixels, and de-activate the readout from the remaining rows of the pixels.

10. The system of example 9, wherein the pixels are disposed in rows 402 and columns 404 and the electrical control circuit comprises a plurality of common row bias lines 306 coupled to each of the pixels 130 in one or more of the rows; and a plurality of common column bias lines 406 coupled to each of the pixels in one or more of the columns. Each of the pixels further comprise each of the detectors 208 comprising two balanced photodiodes 304 connected in series between a pair of the common row bias lines 306 (Vbias1 and Vbias2). The electrical control circuit further comprises protection resistors 308 connected in parallel with the photodiodes and between the pair of the common row bias lines 306. The electrical circuit further comprises at least one diode 300, comprising an anode and a cathode, connected in series with an output from each of the photodiodes.

The pair of common row bias lines 306 (Vbias1 and Vbias2) bias the photodiodes in reverse bias and set a voltage of the at least one diode's 300 anode; and the common column bias lines 406 bias the at least one diode's 300 cathode so that:

(1) the diodes 300 in the selected rows 402 are forward biased for the readout of the output signals 210 from the one or more selected rows 402; and
(2) the diodes 300 in the remaining rows are reverse biased.

10. The system of any of the examples 1-9, wherein the receiver further comprises a splitter 500 only distributing the reference to one or more selected rows 402 of the pixels 130 so as to select readout of the output signals from the one or more selected rows of the pixels and de-activate readout from the remaining rows of the pixels.

11. The system of example 10, wherein the splitter comprises one or more interferometers 502, each of the interferometers comprising a first branch 504 having a first output $P_1$ and an input $P_{IN}$ for receiving the reference 112; and a second branch 506 having a second output $P_2$. Each of interferometers further comprise a first coupler 508 coupling the first branch and the second branch; and a second coupler 510 coupling the first branch and the second branch. The second coupler is positioned m in series with the first branch. Each of the interferometers further comprise a voltage tunable modulator 512 coupled to the first branch or the second branch, the voltage tunable modulator controlling a relative phase of the reference in at least one of the first branch or the second branch, in response to a voltage signal VCntrl, VCntr2 inputted to the voltage modulator, so as to control a relative power of the reference outputted at the first output $P_1$ and the second output $P_2$.

12. The system of example 11, wherein the splitter further comprises a reference detector 514 coupled to the interferometer, the reference detector outputting a current signal IFB1, IFB2 monitoring a fraction of the relative power of the reference at the first output or the second output.

13. The system of example 12, comprising a power distribution circuit 140 comprising an electrical control loop 516 controlling the voltage signal using the current signal as feedback.

14. The system of any of the examples 10-13, wherein the splitter comprises plurality of cascaded tunable power distribution (TPD) circuits (e.g., cascaded interferometers 502).

15. The system of any of the examples 10-14, wherein the interferometers or TPDs are distributed in M layers 600 (where M is an integer), such that the first output $P_1$ and the second output $P_2$ of the one or more interferometers 502, in a previous one of the layers, are each fed to the input $P_{IN}$ of a different one of the interferometers in a next one of the layers, allowing splitting of the reference, inputted to the input of the interferometer in a first one of the layers, to the N outputs comprising the first outputs and second outputs of the interferometers in the last one of the layers. The voltage signals (e.g., VCntrl 1, Cntrl 2, VCntrl 3, V Cntrl k) required for allocating the power to the $N=2^M$ outputs are calibrated for M layers, by the power distribution TPD circuits, for each of the TPD circuits in the j layers $1 \leq j \leq M$, starting with $j=1$:

(a) recording the voltage signals (e.g., VCtrl 1 . . . V Cntrl k) applied to each of the k interferometers in the $j^{th}$ layer, and the sum of the currents (e.g., $I_j$=IFB1+ . . . IFBk) outputted from all the k interferometers in the $j^{th}$ layer, when routing all the power to a top most branch 602 and a bottom most branch 604 in the $(j+1)^{th}$ layer; and (b) adjusting the voltage signals (e.g., V Cntrl 2, VCntrl 3, VCntrl p) to the p interferometers 502 in the $(j+1)^{th}$ layer and noting the sum of the current signals (e.g., $I_2$=IFB2+IFB3+ . . . IFBp) outputted from all the p interferometers in the $(j+1)^{th}$ layer when routing different powers of the reference to each of the remaining outputs in the $(j+1)^{th}$ layer, taking into account knowledge obtained in (a); and such that all the voltage signals (e.g., V Cntrl 1, V Cntrl 2, V Cntrl 3, V Cntrl k, V Cntrl p) are calibrated using only a number M of current nodes, wherein the $j^{th}$ current node comprises the sum of the current signals $I_j=I_1+I_2+ \ldots +k$ outputted from the $j^{th}$ layer and k is the number of TPD circuits in the $j^{th}$ layer.

16. The system of any of the examples 1-15, wherein the beamformer 118 comprises at least one of a first lens, a first mirror, a first beam steerer, or a first phased array 1200 irradiating an entirety of the target 122 with the signal beam 120. The image forming device 128 comprises at least one of a second lens 800, a second mirror, a second beam steerer, or a second phased array 1200 imaging the signal beam 126, after interaction with the target, onto the pixels 130.

17. The system of any of the examples 1-15, wherein the target comprises different points or regions 900 and the beamformer comprises a first beam steerer 904 or first phased array 1200 steering the signal beam comprising at least one collimated beam 902 onto the different points or regions 900 on the target. The image forming device 128 comprises at least one of a second mirror, a second lens 800, a second beam steerer, or a second phased array 1200 imaging the at least one collimated beam, after interaction with the points 900 or regions, onto the pixels 130.

18. The system of example 17, wherein the signal beam 120 comprises a plurality of collimated beams 1000 and the first beam steerer 1004 or first phased array 1200 scans each of the collimated beams across all the points 900 or regions.

19. The system of any of the examples 1-18, wherein the receiver 103 comprises a control circuit 142 adjusting a reference phase of the reference m transmitted to each of the pixels, so that each of the pixels receive the reference having a different reference phase.

20. The system of any of the examples 1-19, wherein the transmitter 102 further comprises a modulator modulating the electromagnetic radiation with at least one of a linear frequency chirp or at least one of a binary encoded phase or amplitude, so as to extract time domain information from the output signals for a ranging application.

21. The system of any of the examples 1-20, wherein the capture area 200 comprises of one or more optical antennas.

22. The coherent imaging system of any of the examples 1-21, wherein the coherent imaging system is configured so that the output signals 210 may be used in an application selected from coherent tomography, light detection and ranging LIDAR, remote sensing, robotics, automation, aerial imaging, or spectroscopy, and the source of coherent electromagnetic radiation comprises one or more lasers 104.

23. A detector array 802, 1402 for coherent detection of electromagnetic radiation, comprising an array of pixels 130, each of the pixels comprising means for collecting (e.g., capture area 200 and equivalents thereof) at least a portion of a signal beam imaged on the pixel by an image forming device, as a collected signal; means for splitting (e.g., waveguides 202 and equivalents thereof) the collected signal into a plurality of collected signals each having different phase shifts; means for mixing (e.g., couplers 204 and equivalents thereof) each of the collected signals with a reference beam so as to form a plurality of mixed signals; and means for detecting (e.g., detectors 208 and equivalents thereof) the mixed signals and outputting a plurality of output electrical signals in response to the mixed signals (and equivalents thereof).

24. The detector array of example 23, wherein the means for collecting, means for splitting, means for mixing, and means for outputting comprise or are implemented using one or more photonic integrated circuits 1400.

25. A coherent imaging system 100 of any of the examples 1-22 comprising the detector array of examples 23 or 24.

26. A multi-modal imaging system comprising of the system of any of the examples 1-25 in combination with a CMOS imager (e.g., complementary metal-oxide semiconductor imager, or imager implemented in CMOS) and/or a radio frequency (RF) radar.

27. An imaging system of any of the examples 1-26 that utilizes artificial intelligence (AI) or machine learning executed on a computer 1900 to compress the imager output data comprising the output signals. In one or more examples, the AI or machine learning is trained to compress the imager output data (e.g., image compression) using the output signals.

28. An imaging system of any of the examples 1-27 that utilizes artificial intelligence (AI) or machine learning algorithm executed on a computer 1900 and processing the output signals for object detection and target/object classification, so that the target is detected and classified by the AI or machine learning algorithm analyzing the output signals form the coherent imaging system. In one or more examples, the AI or machine learning is trained to detect and/or classify the target using the output signals.

29. A detector array 802, 1402 for coherent detection of electromagnetic radiation, comprising an array of pixels 130, each of the pixels comprising one or more photonic integrated circuits or circuitry 1400 (e.g., configured for):
collecting at least a portion of a signal beam imaged on the pixel by an image forming device, as a collected signal;
splitting the collected signal into a plurality of collected signals each having different phase shifts;
mixing each of the collected signals with a reference beam so as to form a plurality of mixed signals; and
detecting the mixed signals and outputting a plurality of output electrical signals in response to the mixed signals.

30. A detector array 802, 1402 for coherent detection of electromagnetic radiation, comprising an array of pixels 130, each of the pixels comprising means for collecting 200 at least a portion of a signal beam imaged on the pixel by an image forming device, as a collected signal; means for splitting 202 the collected signal into a plurality of collected signals each having different phase shifts; means for mixing 204 each of the collected signals with a reference beam so as to form a plurality of mixed signals; and means for detecting 208 the mixed signals and outputting a plurality of output electrical signals in response to the mixed signals (and equivalents thereof).

31. The coherent imaging system of any of the examples 1-30, wherein the transmitter 102 further comprising a modulator 114 for modulating at least one of a phase or an amplitude of the electromagnetic radiation, so as to form the signal beam 110 comprising modulated electromagnetic radiation 116 transmitted to the target 32. The coherent imaging system of any of the examples 1-31, wherein the transmitter further comprises an illuminator, flash, or beamformer 118 transmitting the signal beam 110 to the target.

33. The coherent imaging system of any of the examples 1-32, wherein the transmitter and the receiver, or the transmitter aperture and receiver aperture, have a common beamforming mechanism.

34. The coherent imaging system of any of the examples 1-33, wherein the transmitter and receiver, or the beamforming mechanism of example 33, or the receiver aperture and the transmitter receiver aperture have common antennas for both transmit and receive.

35. The coherent imaging system of any of the examples 1-34, further comprising a circuit 132 or amplifier amplifying the output signals 210 for further processing.

36. The coherent imaging system of any of the examples 1-35, wherein the electromagnetic radiation and signal beam comprises, but is not limited to, wavelengths in a range of 400 nanometers (nm)–10 micrometers, 360 nm to 860 nm, 1000-1700 nm, up to mm wavelengths, optical wavelengths, visible wavelengths, infrared wavelengths, or telecom wavelengths.

37. The coherent imaging system of example 36, wherein the photonic integrated circuits or means for collecting (e.g., capture area 200, optical antenna(s)), means for splitting (e.g., waveguides 202), means for mixing (e.g., couplers 204), and means for detecting (e.g., detectors 208) are configured and/or dimensioned for collecting, splitting, mixing, and detecting the electromagnetic radiation having the wavelengths in a range of 400 nanometers (nm)–10 micrometers, 360 nm to 860 nm, 1000-1700 nm, up to millimeter wavelengths, optical wavelengths, visible wavelengths, infrared wavelengths, or telecom wavelengths.

Method of Operating

Figure 18:
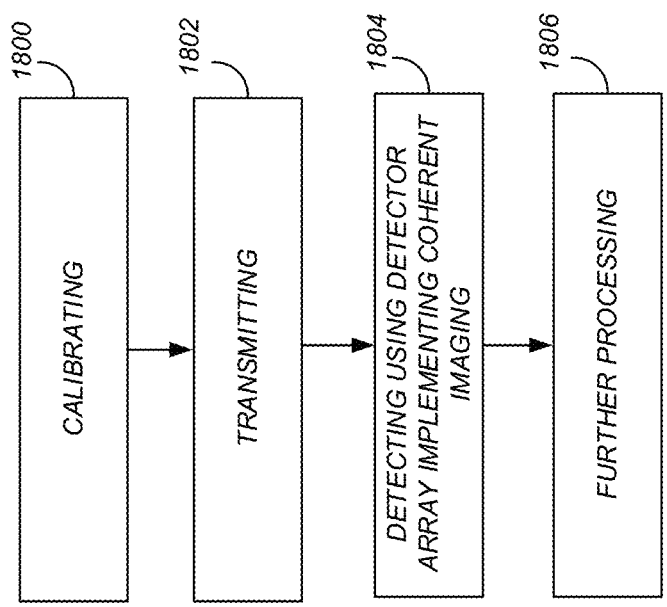

FIG. 18 illustrates a method of imaging using the coherent imaging system of any of the examples 1-36 of Block 1706 above, comprising optionally calibrating 1800 a detector array (e.g., the interferometers in example 15); transmitting 1802 electromagnetic radiation to a target using the transmitter 102, collecting the electromagnetic radiation after interaction with the target on a detector array 802, 1402 of pixels 130 using coherent imaging to form output signals; and processing the output signals for an application.

Hardware Environment

Figure 19:
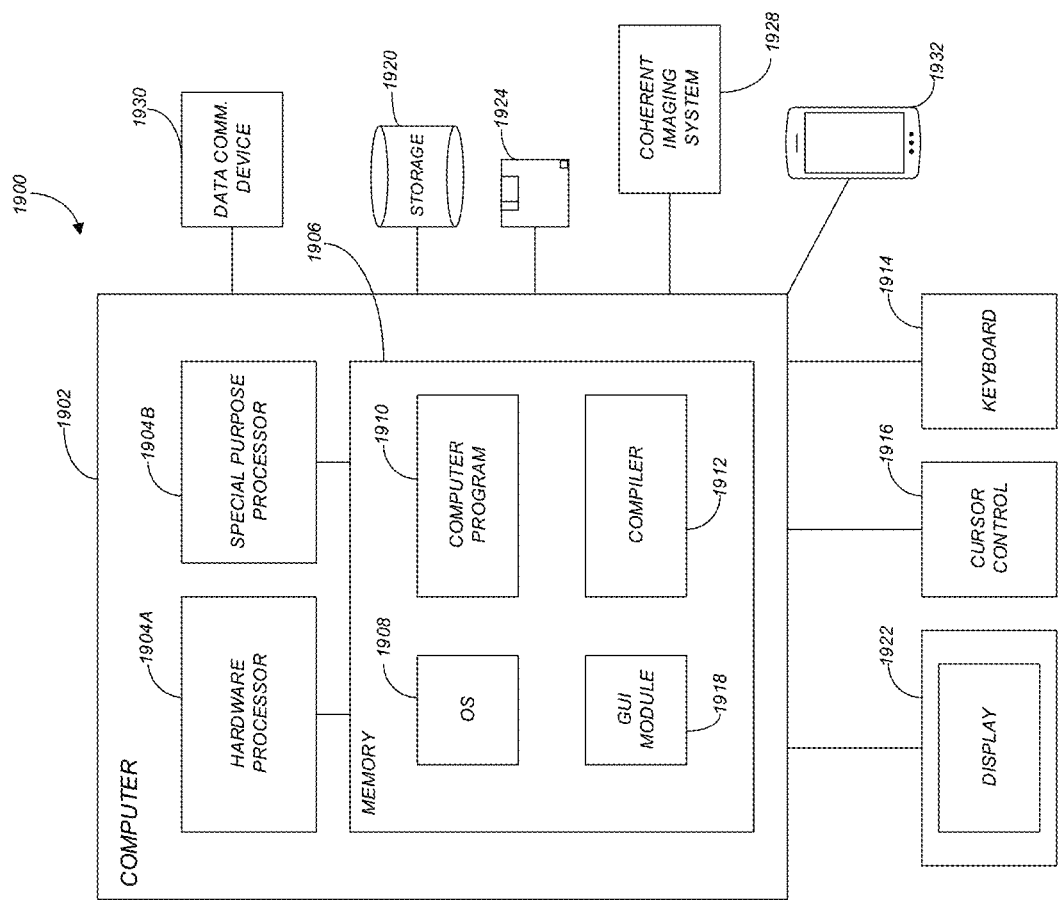
FIG. 19. Example computer system embodiment for implementing imaging according to one or more embodiments of the present invention.

FIG. 19 is an exemplary hardware and software environment 1900 (referred to as a computer-implemented system and/or computer-implemented method) used to implement one or more embodiments of the invention. The hardware and software environment includes a computer 1902 and may include peripherals. Computer 1902 may be a user/client computer, server computer, or may be a database computer. The computer 1902 comprises a hardware processor 1904A and/or a special purpose hardware processor 1904B (hereinafter alternatively collectively referred to as to processor 1904) and a memory 1906, such as random access memory (RAM). The computer 1902 may be coupled to, and/or integrated with, other devices, including input/output (I/O) devices such as a keyboard 1914 and a cursor control device 1916. In one or more embodiments, computer 1902 may be coupled to, or may comprise, a portable or mobile device 1932 (e.g., cellular device, laptop, tablet, smartphone, multi-touch device, or other internet enabled device executing on various platforms and operating systems).

In one embodiment, the computer 1902 operates by the hardware processor 1904A performing instructions defined by the computer program 1910 (e.g., a signal processing, beam steering, modulation, biasing for row-column readout, AI or machine learning application or other computer implementable function or method described herein) under control of an operating system 1908. The computer program 1910 and/or the operating system 1908 may be stored in the memory 1906 and may interface with the user and/or other devices to accept input and commands and, based on such input and commands and the instructions defined by the computer program 1910 and operating system 1908, to provide output and results. Output/results may be presented on the display 1922 or provided to another device for presentation or further processing or action. The image may be provided through a graphical user interface (GUI) module 1918. Although the GUI module 1918 is depicted as a separate module, the instructions performing the GUI functions can be resident or distributed in the operating system 1908, the computer program 1910, or implemented with special purpose memory and processors.

Some or all of the operations performed by the computer 1902 according to the computer program 1910 instructions may be implemented in a special purpose processor 1904B. In this embodiment, some or all of the computer program 1910 instructions may be implemented via firmware instructions stored in a read only memory (ROM), a programmable read only memory (PROM) or flash memory within the special purpose processor 1904B or in memory 1906. The special purpose processor 1904B may also be hardwired through circuit design to perform some or all of the operations to implement the present invention. Further, the special purpose processor 1904B may be a hybrid processor, which includes dedicated circuitry for performing a subset of functions, and other circuits for performing more general functions such as responding to computer program 1910 instructions. In one embodiment, the special purpose processor 1904B is an application specific integrated circuit (ASIC) or Field Programmable Gate Array (FPGA).

The computer 1902 may also implement a compiler 1912 that allows an application or computer program 1910 written in a programming language (such as C, C++ or other language) to be translated into processor 1904 readable code. Alternatively, the compiler 1912 may be an interpreter that executes instructions/source code directly, translates source code into an intermediate representation that is executed, or that executes stored precompiled code. Such source code may be written in a variety of programming languages. After completion, the application or computer program 1910 accesses and manipulates data accepted from I/O devices and stored in the memory 1906 of the computer 1902 using the relationships and logic that were generated using the compiler 1912.

The computer 1902 also optionally comprises an external communication device such as a modem, satellite link, Ethernet card, or other device for accepting input from, and providing output to, other computers 1902.

In one embodiment, instructions implementing the operating system 1908, the computer program 1910, and the compiler 1912 are tangibly embodied in a non-transitory computer-readable medium, e.g., data storage device 1920, which could include one or more fixed or removable data storage devices, such as a zip drive, floppy disc drive 1924, hard drive, CD-ROM drive, tape drive, etc. Further, the operating system 1908 and the computer program 1910 are comprised of computer program 1910 instructions which, when accessed, read and executed by the computer 1902, cause the computer 1902 to perform the steps necessary to implement and/or use the present invention or to load the program of instructions into a memory 1906, thus creating a special purpose data structure causing the computer 1902 to operate as a specially programmed computer executing the method steps described herein. Computer program 1910 and/or operating instructions may also be tangibly embodied in memory 1906 and/or data communications devices 1930, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 1902.

Figure 20:
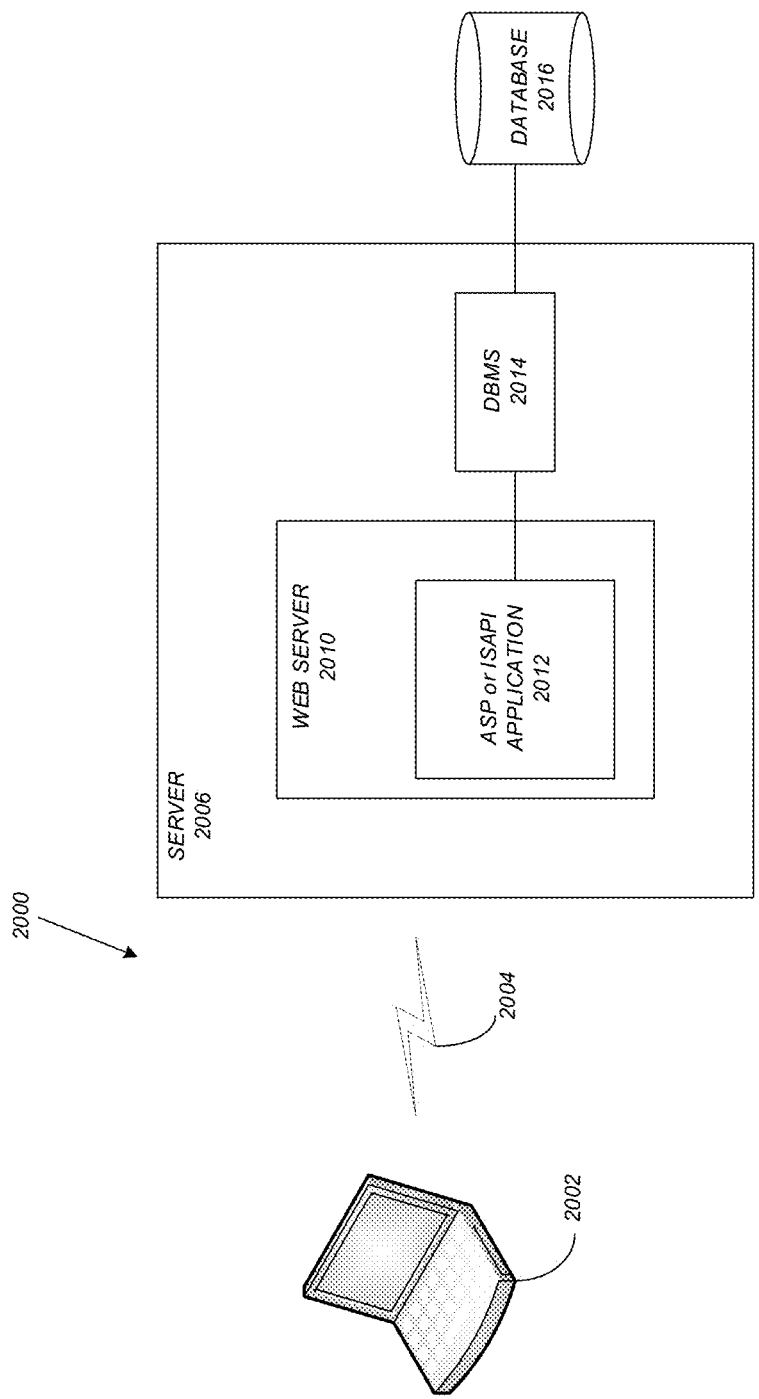
FIG. 20. Example network computer system for implementing imaging according to one or more embodiments of the present invention.

FIG. 20 schematically illustrates a typical distributed/cloud-based computer system 2000 using a network 2004 to connect client computers 2002 to server computers 2006. A typical combination of resources may include a network 2004 comprising the Internet, LANs (local area networks), WANs (wide area networks), SNA (systems network architecture) networks, or the like, clients 2002 that are personal computers or workstations (as set forth in FIG. 19), and servers 2006 that are personal computers, workstations, minicomputers, or mainframes (as set forth in FIG. 19). However, it may be noted that different networks such as a cellular network (e.g., GSM [global system for mobile communications] or otherwise), a satellite based network, or any other type of network may be used to connect clients 2002 and servers 2006 in accordance with embodiments of the invention.

A network 2004 such as the Internet connects clients 2002 to server computers 2006. Network 2004 may utilize ethernet, coaxial cable, wireless communications, radio frequency (RF), etc. to connect and provide the communication between clients 2002 and servers 2006. Further, in a cloud-based computing system, resources (e.g., storage, processors, applications, memory, infrastructure, etc.) in clients 2002 and server computers 2006 may be shared by clients 2002, server computers 2006, and users across one or more networks. Resources may be shared by multiple users and can be dynamically reallocated per demand. In this regard, cloud computing may be referred to as a model for enabling access to a shared pool of configurable computing resources.

Clients 2002 may execute a client application or web browser and communicate with server computers 2006 executing web servers 2010. Such a web browser is typically a program such as MICROSOFT INTERNET EXPLORER/EDGE, OPERA, APPLE SAFARI, GOOGLE CHROME, etc. Further, the software executing on clients 2002 may be downloaded from server computer 2006 to client computers 2002 and installed as a plug-in or ACTIVEX control of a web browser. Web server 2010 may host an Active Server Page (ASP) or Internet Server Application Programming Interface (ISAPI) application 2012, which may be executing scripts. The scripts invoke objects that execute business logic (referred to as business objects). The business objects then manipulate data in database 2016 through a database management system (DBMS) 2014. Alternatively, database 2016 may be part of, or connected directly to, client 2002 instead of communicating/obtaining the information from database 2016 across network 2004.

Generally, these components 2000-2016 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 2002 and 2006 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 2002 and 2006. Embodiments of the invention are implemented as a software/application on a client 2002 or server computer 2006. Further, as described above, the client 2002 or server computer 2006 may comprise a thin client device or a portable device that has a multi-touch-based display.

Advantages and Improvements

A coherent imaging system according to one or more embodiments described herein suppresses the dynamic phase variations between the illumination and reference path as well as the phase contributions from coherent source (e.g., laser) imperfections, such as phase and intensity fluctuations. In one or more applications requiring an ultra-high sensitivity measurement, the coherent imaging system is configured to simultaneously capture both the phase and intensity of the coherent source. Since the coherent imager does not suffer from the phase and intensity fluctuations plaguing traditional coherent imagers, signal acquisition time may be reduced significantly, or the coherent imager may be used to capture images with much higher resolution.

In one or more embodiments, the coherent imaging system comprises a row-column readout architecture and a novel amplitude distribution system that helps with the scalability of the array to tens of megapixels with a low complexity.

Example applications for the coherent imaging system include, but are not limited to, coherent tomography, LIDAR, remote sensing, robotics, automation, aerial imaging, and spectroscopy. The coherent imaging system can be used as a standalone device or in conjunction with other sensors such as CMOS imagers, RF and mm wave radar sensors, etc., to create a multi-modal imaging system. In yet further examples, the coherent imaging system may be implemented using image reconstruction enhancement techniques, such as those used for multi-modal imaging and target detection. In yet other examples, the coherent imaging system may be implemented using categorization schemes such as those utilizing machine learning algorithms.

REFERENCES

The following references are incorporated by reference herein (referenced by numbers in brackets, e.g., [x], in the specification above).

[1] Firooz Aflatouni, Behrooz Abiri, Angad Rekhi, and Ali Hajimiri, "Nanophotonic projection system," Opt. Express 23, 21012-21022 (2015)

[2] B. Abiri, R. Fatemi and A. Hajimiri, "A 1-D Heterodyne Lens-Free Optical Phased Array Camera With Reference Phase Shifting," in *IEEE Photonics Journal*, vol. 10, no. 5, pp. 1-12, October 2018, Art no. 6601712, doi: 10.1109/JPHOT.2018.2871823.

[3] Firooz Aflatouni, Behrooz Abiri, Angad Rekhi, and Ali Hajimiri, "Nanophotonic coherent imager," Opt. Express 23, 5117-5125 (2015)

[4] B. Behroozpour et al., "11.8 Chip-scale electro-optical 3D FMCW lidar with 8 μm ranging precision," 2016 *IEEE International Solid-State Circuits Conference (ISSCC)*, San Francisco, CA, USA, 2016, pp. 214-216, doi: 10.1109/ISSCC.2016.7417983.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A coherent imaging system, comprising:
   a transmitter comprising:
      a coherent source of electromagnetic radiation;
      a power splitter for splitting the electromagnetic radiation into a reference and a signal beam transmitted to a target; and a receiver positioned to receive the signal beam reflected from, or transmitted through, the target, the receiver comprising:
an image forming device; and
an array of pixels, each of the pixels comprising:
a capture area for collecting a portion of the signal beam imaged on the capture area by the image forming device, as a collected signal;
a plurality of waveguides distributing the reference and the collected signal, along a plurality of paths, to a plurality of couplers, wherein:
the collected signals in different paths have different phase shifts; and
each of the couplers mix the reference with a different one of the collected signals having a different one of the phase shifts so as to form a plurality of mixed signals; and
a plurality of detectors coupled to outputs of the couplers so as to detect each of the mixed signals and output a plurality of output signals in response thereto.

2. The coherent imaging system of claim 1, wherein:
the couplers comprise a first coupler and a second coupler;
the collected signals comprise a first signal and a second signal having the phase shift of 90 degrees relative the first signal;
the mixed signals comprise a first mixed signal and a second mixed signal;
the first coupler mixes the first signal with the reference to form the first mixed signal comprising an in-phase signal;
the second coupler mixes the second signal with the reference to form the second mixed signal comprising a quadrature signal; and
the detectors comprise a first detector detecting the in-phase signal and a second detector detecting the quadrature signal.

3. The coherent imaging system of claim 2, further comprising a circuit summing the squares of the output signals.

4. The coherent imaging system of claim 1, wherein:
the collected signals comprise a first signal, a second signal having the phase shift of a first angle relative to the first signal; a third signal having the phase shift of a second angle relative to the first signal; and a fourth signal having the phase shift of a third angle relative to the first signal;
the couplers comprise a first coupler, a second coupler, a third coupler, and a fourth coupler outputting the mixed signals comprising a first mixed signal, a second mixed signal, a third mixed signal, and a fourth mixed signal; and
the detectors comprise a first detector detecting the first mixed signal, a second detector detecting the second mixed signal, a third detector detecting the third mixed signal, and a fourth detector detecting the fourth mixed signal.

5. The coherent imaging system of claim 1, wherein the transmitter and the receiver share an aperture, so that:
the signal beam is transmitted to the target from the transmitter through the aperture, and
the signal beam is received in the receiver through the aperture.

6. The coherent imaging system of claim 5, wherein the transmitter and the receiver comprise the aperture sharing optical antennas, so that the optical antennas transmit the signal beam to the target and the optical antennas receive the signal beam from the target.

7. The coherent imaging system of claim 5, wherein the transmitter and receiver comprise the aperture sharing an optical beamforming system, so that the optical beamforming system forms:
the signal beam transmitted from the transmitter onto the target, and
the signal beam received from the target onto the pixels.

8. The coherent imaging system of claim 1, wherein:
the receiver further comprises an electrical control circuit, the electrical control circuit biasing the pixels so as to:
select readout of the output signals from one or more selected rows of the pixels, and
de-activate the readout from the remaining rows of the pixels.

9. The system of claim 8, wherein:
the pixels are disposed in rows and columns;
the electrical control circuit comprises:
a plurality of common row bias lines coupled to each of the pixels in one or more of the rows; and
a plurality of common column bias lines coupled to each of the pixels in one or more of the columns;
each of the pixels further comprise:
each of the detectors comprising two balanced photodiodes connected in series between a pair of the common row bias lines;
protection resistors in parallel with the photodiodes and between the pair of the common row bias lines;
at least one diode, comprising an anode and a cathode, connected in series with an output from the photodiodes; and
wherein:
the pair of common row bias lines bias the photodiodes in reverse bias and set a voltage of the anode; and
the common column bias lines bias the cathode;
so that:
the diodes in the selected rows are forward biased for the readout of the output signals from the one or more selected rows; and
the diodes in the remaining rows are reverse biased.

10. The system of claim 1, wherein the receiver further comprises a splitter only distributing the reference to one or more selected rows of the pixels so as to select readout of the output signals from the one or more selected rows of the pixels and de-activate readout from the remaining rows of the pixels.

11. The system of claim 10, wherein the splitter comprises one or more interferometers, each of the interferometers comprising:
a first branch having a first output and an input for receiving the reference;
a second branch having a second output;
a first coupler coupling the first branch and the second branch;
a second coupler coupling the first branch and the second branch, wherein the second branch is positioned in series with the first branch; and
a voltage tunable modulator coupled to the first branch or the second branch, the voltage tunable modulator controlling a relative phase of the reference in at least one of the first branch or the second branch, in response to a voltage signal inputted to the voltage tunable modulator, so as to control a relative power of the reference outputted at the first output and the second output.

12. The system of claim 11, wherein:

the splitter further comprises a reference detector coupled to the interferometer, the reference detector outputting a current signal monitoring a fraction of the relative power of the reference at the first output or the second output; and the system further comprising a power distribution circuit controlling the voltage signal using the current signal as feedback.

13. The system of claim 12, wherein:

the splitter comprises a plurality of the interferometers comprising cascaded interferometers, the interferometers are distributed in M layers, such that the first output and the second output of the one or more interferometers, in a previous one of the layers, are each fed to the input of a different one of the interferometers in a next one of the layers, allowing splitting of the reference, inputted to the input of the interferometer in a first one of the layers, to N outputs comprising the first outputs and second outputs of the interferometers in the last one of the layers; and the voltage signals required for allocating the power to the $N=2^M$ outputs are calibrated for M layers, by the power distribution circuit, for each of the interferometers in the j layers $1 \leq j \leq M$, starting with j=1:

(a) recording the voltage signals applied to each of the interferometers in the $j^{th}$ layer, and the sum of the current signals outputted from all the interferometers in the $j^{th}$ layer, when routing all the power to a top most branch and a bottom most branch in the $(j+1)^{th}$ layer; and (b) adjusting the voltage signals to the interferometers in the $(j+1)^{th}$ layer and noting the sum of the current signals outputted from the interferometers in the $(j+1)^{th}$ layer when routing different powers of the reference to each of the remaining outputs in the $(j+1)^{th}$ layer, taking into account knowledge obtained in (a); and such that all the voltage signals are calibrated using only a number M of current nodes, wherein the $j^{th}$ current node comprises the sum of the current signals outputted from the $j^{th}$ layer.

14. The system of claim 1, further comprising a beamformer comprises comprising at least one of a first lens, a first mirror, a first beam steerer, or a first optical phased array irradiating an entirety of the target with the signal beam or one or more different points on the target with the signal beam comprising one or more collimated beams; and wherein:

the image forming device comprises at least one of a second lens, a second mirror, a second beam steerer, or a second optical phased array imaging the signal beam, after interaction with the target, onto the pixels.

15. The system of claim 1, wherein the receiver comprises at least one of the following:

the receiver comprising a control circuit adjusting a reference phase of the reference transmitted to each of the pixels, so that each of the pixels receive the reference having a different reference phase, or a modulator modulating the electromagnetic radiation with at least one of a linear frequency chirp or at least one of a binary encoded phase or amplitude, so as to extract time domain information from the output signals for a ranging application.

16. The system of claim 1, wherein the capture area comprises one or more optical antennas.

17. The coherent imaging system of claim 1, wherein:

the coherent imaging system is configured so that the output signals may be used in an application selected from coherent tomography, LIDAR, remote sensing, robotics, automation, aerial imaging, or spectroscopy, and the coherent source of electromagnetic radiation comprises one or more lasers.

18. A multi-modal imaging system comprising of the system in claim 1 in combination with at least one of a CMOS imager or an RF radar system.

19. The imaging system of claim 1 further comprising a computer comprising one or more processors; one or more memories; and one or more computer executable instructions stored on the one or more memories, wherein the computer executable instructions are configured to execute at least one of:

a first artificial intelligence or machine learning algorithm compressing imager output data obtained from the output signals, or a second artificial intelligence or machine learning algorithm analyzing data obtained from or comprising the output signals, so as to detect the target or classify the target.

* * * * *